(12) United States Patent
Miyazaki et al.

(10) Patent No.: US 11,942,411 B2
(45) Date of Patent: Mar. 26, 2024

(54) SEMICONDUCTOR DEVICE

(71) Applicant: Mitsubishi Electric Corporation, Tokyo (JP)

(72) Inventors: Takamasa Miyazaki, Tokyo (JP); Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 89 days.

(21) Appl. No.: 17/564,940

(22) Filed: Dec. 29, 2021

(65) Prior Publication Data
US 2022/0319974 A1 Oct. 6, 2022

(30) Foreign Application Priority Data
Apr. 1, 2021 (JP) .................................. 2021-062651

(51) Int. Cl.
*H01L 23/498* (2006.01)
*H01L 23/00* (2006.01)
(Continued)

(52) U.S. Cl.
CPC ........ *H01L 23/49844* (2013.01); *H01L 24/48* (2013.01); *H01L 25/115* (2013.01);
(Continued)

(58) Field of Classification Search
CPC . H01L 23/49844; H01L 24/48; H01L 25/115; H01L 2224/48225; H01L 23/3735; H01L 25/072; H01L 23/5386; H01L 24/06; H01L 24/85; H01L 2224/04042; H01L 2224/4813; H01L 2224/48227;
(Continued)

(56) References Cited

U.S. PATENT DOCUMENTS

2007/0075419 A1* 4/2007 Fukuda ............. H01L 23/49531
257/E23.036
2015/0155797 A1 6/2015 Okayama
(Continued)

FOREIGN PATENT DOCUMENTS

JP 2005-341790 A 12/2005
JP 2018-010982 A 1/2018
(Continued)

OTHER PUBLICATIONS

An Office Action; "Notice of Reasons for Refusal," mailed by the Japanese Patent Office dated Jan. 30, 2024, which corresponds to Japanese Patent Application No. 2021-062651 and is related to U.S. Appl. No. 17/564,940; with English language translation.

Primary Examiner — Elias Ullah
(74) Attorney, Agent, or Firm — Studebaker & Brackett PC

(57) ABSTRACT

RC-IGBT chips and RC-IGBT chips correspond to a pair of adjacent RC-IGBT chips in an X direction between the RC-IGBT chips. The RC-IGBT chips satisfy a first arrangement condition in which the chips are separately arranged without a bonding point region and a bonding point region overlapping each other in a Y direction, and a second arrangement condition in which, in the Y direction, the chips are arranged to partially overlap so that a part of emitter electrodes excluding the bonding point region and the bonding point region overlap. The RC-IGBT chips also satisfy the first and second arrangement conditions described above.

12 Claims, 16 Drawing Sheets

(51) Int. Cl.
    *H01L 25/11*     (2006.01)
    *H02M 7/00*     (2006.01)
    *H02M 7/5387*     (2007.01)

(52) U.S. Cl.
    CPC ... *H02M 7/003* (2013.01); *H01L 2224/48225* (2013.01); *H02M 7/5387* (2013.01)

(58) Field of Classification Search
    CPC ............ H01L 24/49; H01L 2224/0603; H01L 2224/48137; H01L 2224/4846; H01L 2224/49111; H01L 2224/49175; H01L 2224/85447; H01L 2924/00014; H01L 2924/19107; H01L 23/50; H02M 7/003; H02M 7/5387; H02M 1/327
    See application file for complete search history.

(56)     References Cited

U.S. PATENT DOCUMENTS

| | | |
|---|---|---|
| 2016/0056132 A1 | 2/2016 | Bayerer et al. |
| 2018/0019695 A1 | 1/2018 | Hasegawa et al. |
| 2020/0395343 A1 | 12/2020 | Kakefu et al. |

FOREIGN PATENT DOCUMENTS

| | | |
|---|---|---|
| JP | 2019-162032 A | 9/2019 |
| WO | 2013/179547 A1 | 12/2013 |
| WO | 2020/059285 A1 | 3/2020 |

\* cited by examiner

F I G. 3
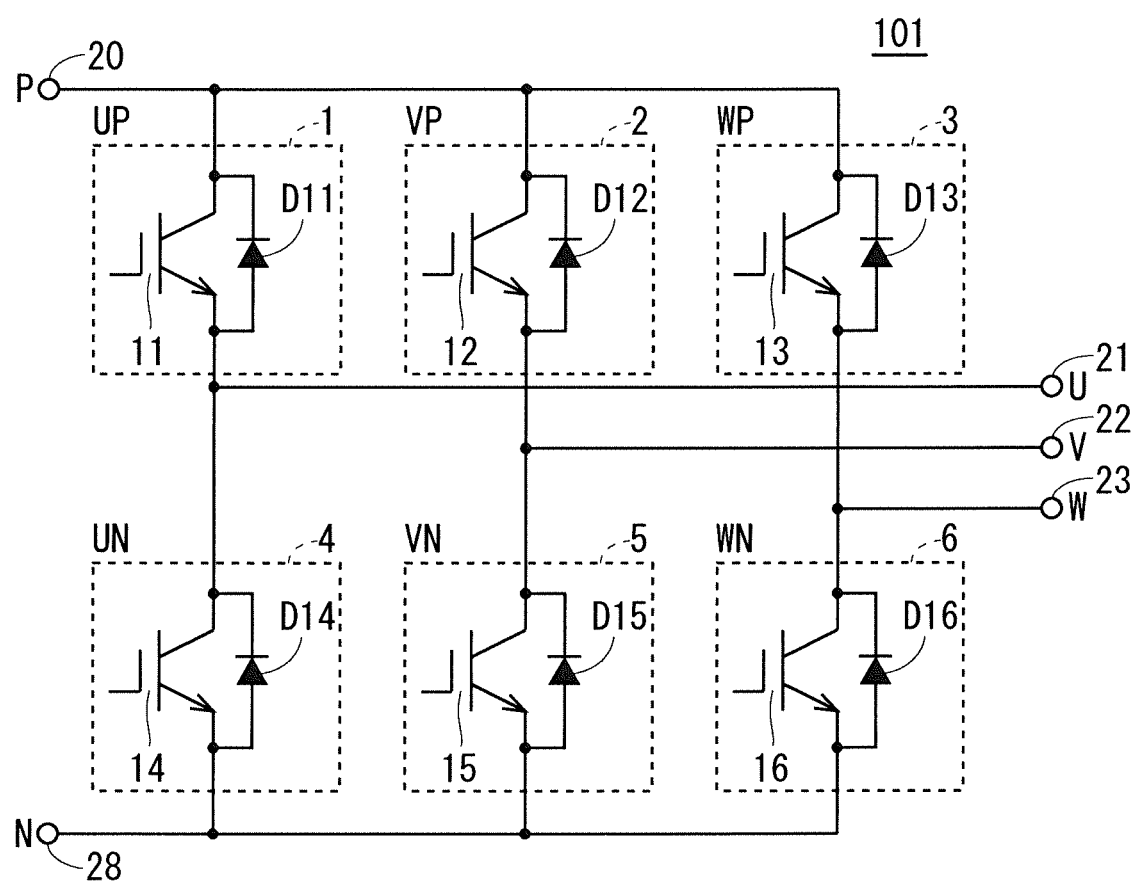

F I G. 6
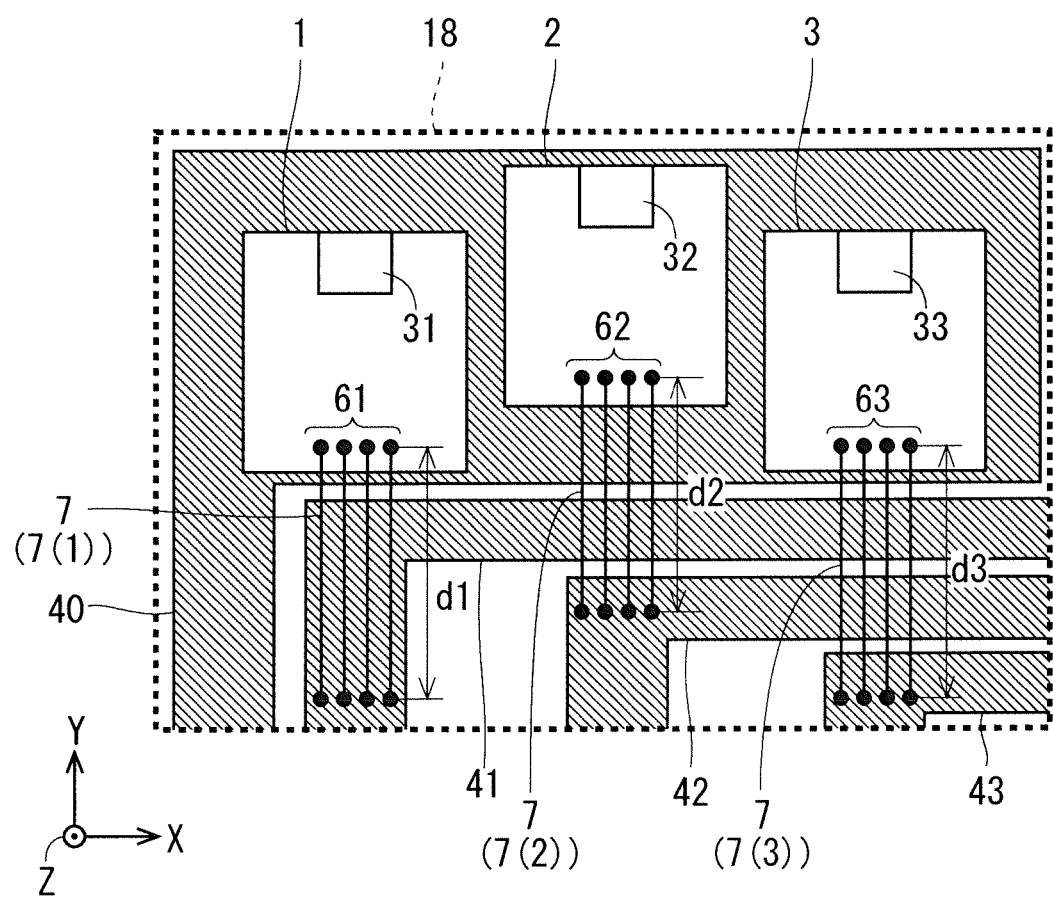

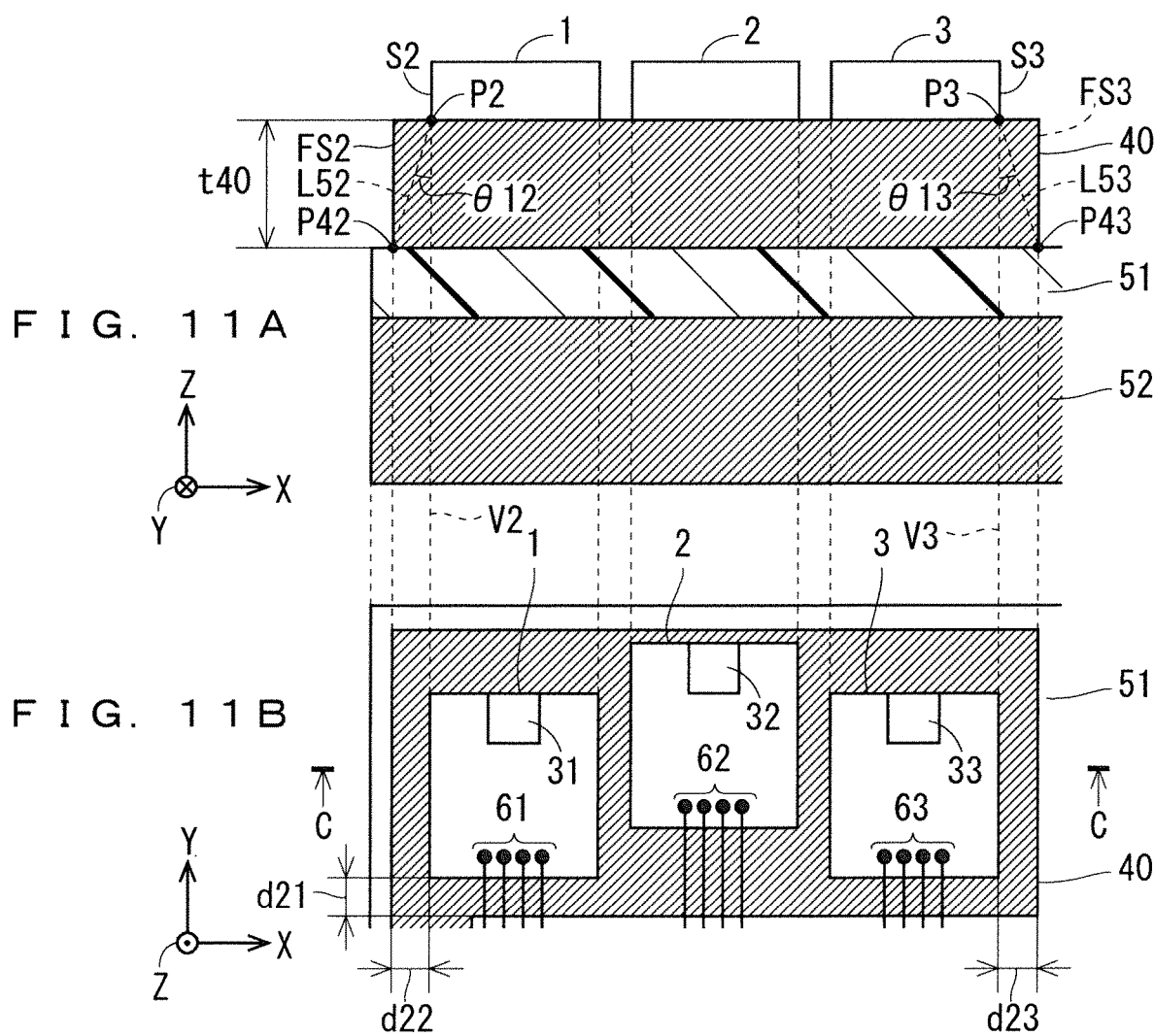

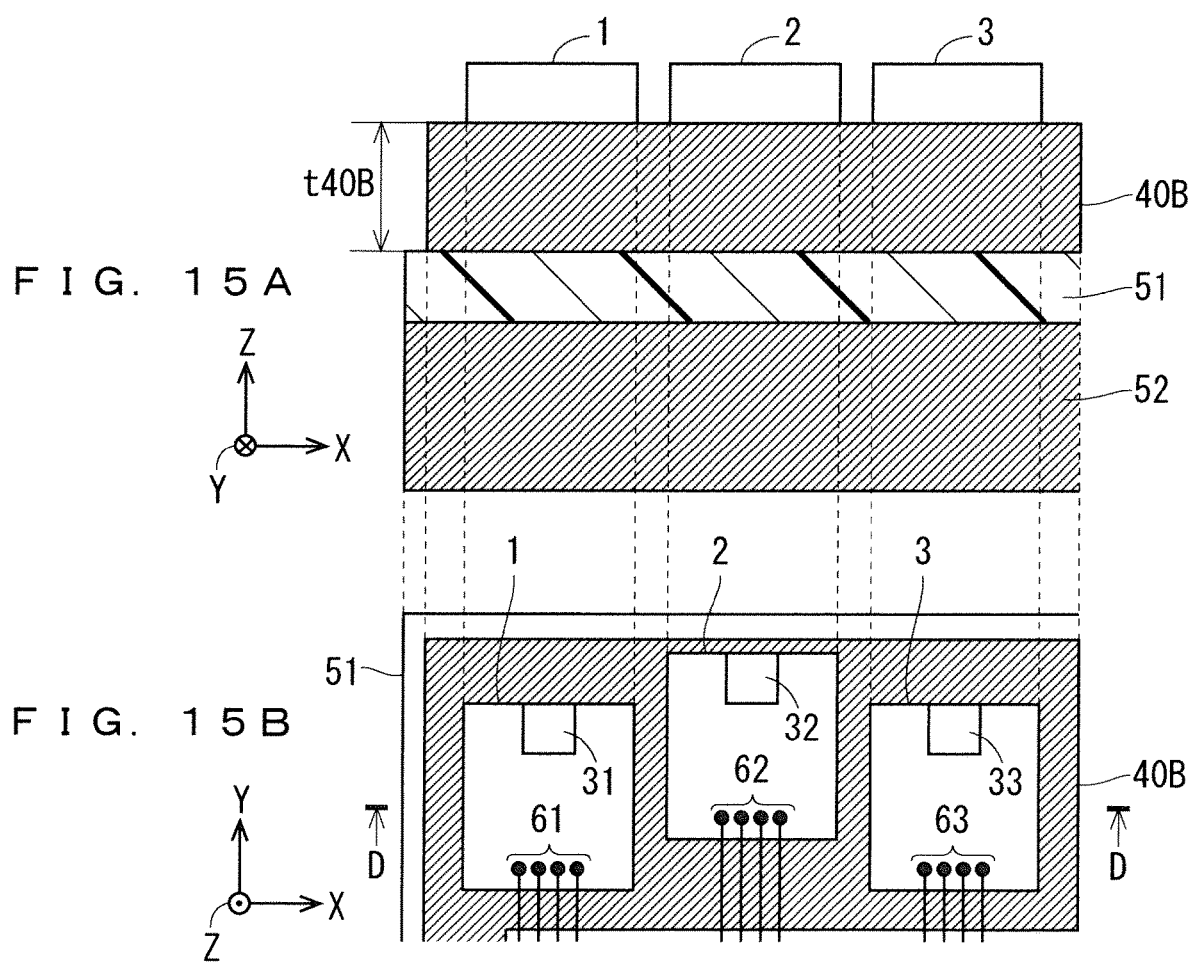

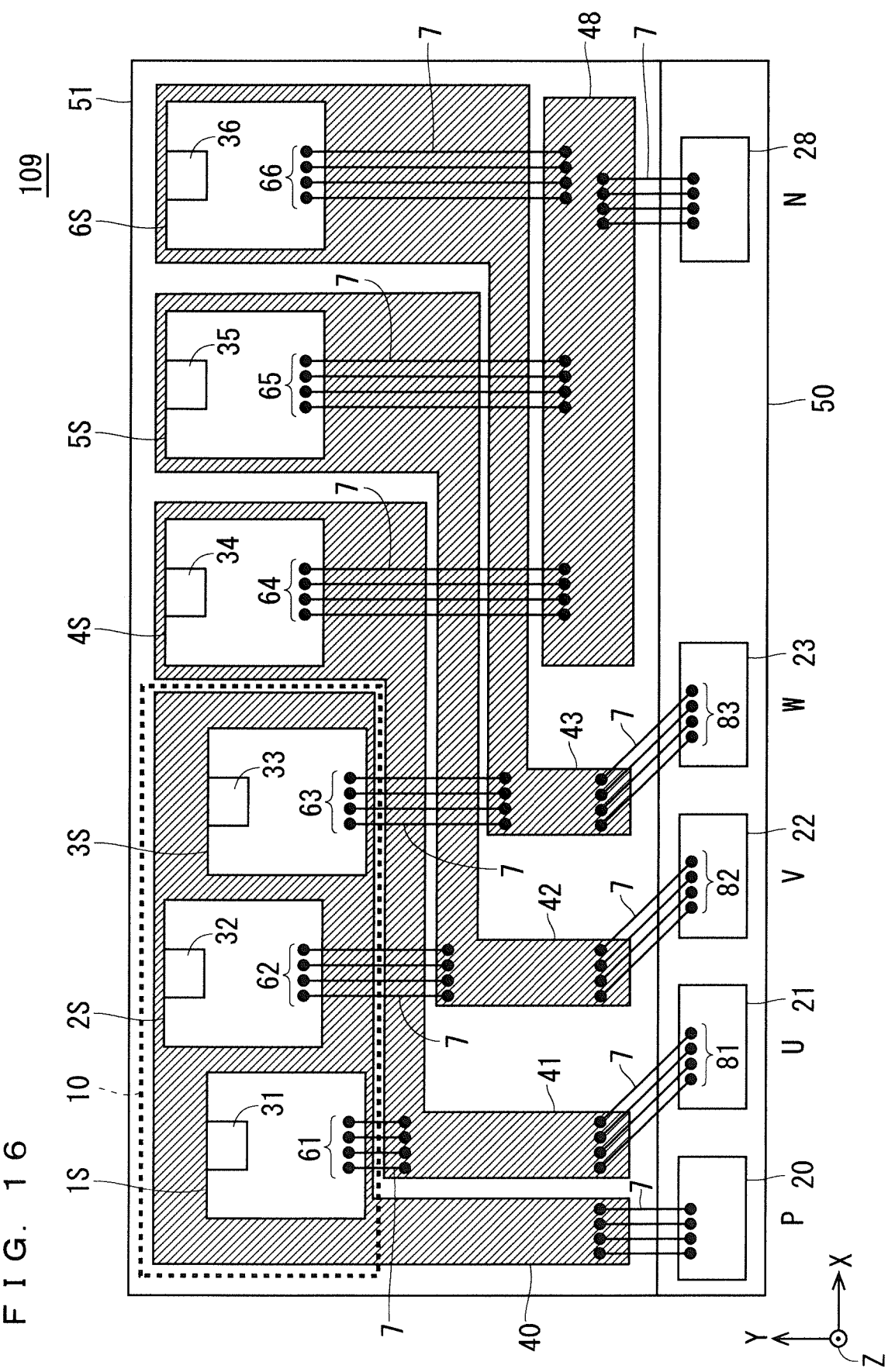

SEMICONDUCTOR DEVICE

BACKGROUND OF THE INVENTION

Field of the Invention

The present disclosure relates to a semiconductor device including a plurality of semiconductor chips.

Description of the Background Art

Conventionally, as a semiconductor device including a plurality of semiconductor chips, for example, there is a semiconductor module disclosed in Japanese Patent Application Laid-Open No. 2018-10982. In the semiconductor module disclosed in Japanese Patent Application Laid-Open No. 2018-10982, arranging a semiconductor chip (hereinafter, abbreviated as "RC-IGBT chip") in which a switching element and a reflux element are formed into one chip in a staggered manner improves heat dissipation. The RC-IGBT chip adopts an IGBT as a switching element, and adopts a diode as a reflux element.

In the conventional semiconductor module disclosed in Japanese Patent Application Laid-Open No. 2018-10982, since the RC-IGBT chips are arranged in a staggered manner, heat dissipation between the RC-IGBT chips can be improved, and the life of the device can be expected to be prolonged.

On the other hand, the conventional semiconductor module has a problem that the distance between the RC-IGBT chips becomes long as the RC-IGBT chips are arranged in a staggered manner, and thus the semiconductor device becomes large.

SUMMARY

Obtained is a semiconductor device including a plurality of semiconductor chip capable of achieving both long life and miniaturization of the device.

A semiconductor device according to the present disclosure includes a common circuit pattern and a plurality of semiconductor chips.

The plurality of semiconductor chips are arranged along a first direction on the common circuit pattern.

Each of the plurality of semiconductor chips includes a switching element, a first main electrode of the switching element is provided on an upper surface, a second main electrode of the switching element is provided on a lower surface, and a part of a first main electrode is allocated to a wiring connection region.

The semiconductor device according to the present disclosure further includes a plurality of external wiring lines each of which is electrically connected to the wiring connection region of a corresponding semiconductor chip among the plurality of semiconductor chips.

Among the plurality of semiconductor chips, a pair of semiconductor chips adjacent to each other in the first direction satisfies first and second arrangement conditions.

The first arrangement condition is that the pair of semiconductor chips is separately arranged without the wiring connection regions overlapping each other in a second direction intersecting the first direction.

The second arrangement condition is that the pair of semiconductor chips is arranged to partially overlap so that a part of regions other than the wiring connection regions overlap in the second direction.

Since the semiconductor device of the present disclosure satisfies the above-described first arrangement condition, the distance between the wiring connection regions in the pair of semiconductor chips can be increased to suppress thermal interference between the pair of semiconductor chips.

As a result, the semiconductor device of the present disclosure can suppress the temperature rise inside the plurality of semiconductor chips and prolong the life of the device.

Furthermore, since the semiconductor device of the present disclosure satisfies the second arrangement condition described above, the formation area of the plurality of semiconductor chips provided on the common circuit pattern can be reduced to the minimum necessary to achieve miniaturization of the device.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 3 is a circuit diagram showing an equivalent circuit implemented with the six RC-IGBT chips shown in FIG. 1;

FIG. 6 is an enlarged plan view showing a periphery of the RC-IGBT chips and wires in FIG. 5;

FIGS. 11A and 11B are explanatory diagrams schematically showing a configuration of a comparative semiconductor device;

FIGS. 15A and 15B are explanatory diagrams schematically showing a configuration of a semiconductor device of an eighth preferred embodiment; and FIG. 16 is a plan view schematically showing a configuration of a semiconductor device of a ninth preferred embodiment.

DESCRIPTION OF THE PREFERRED EMBODIMENTS

First Preferred Embodiment

Figure 1:
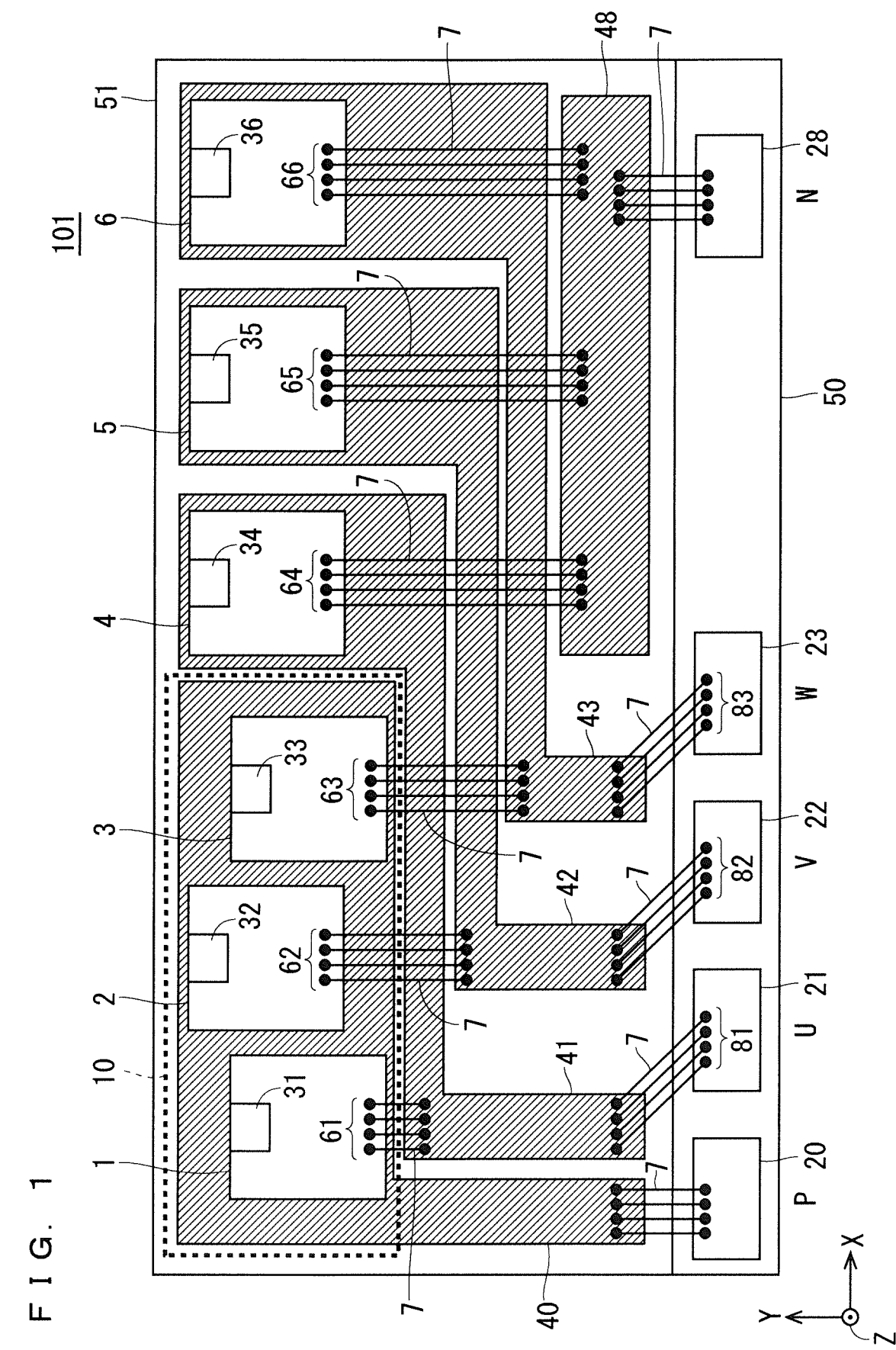
FIG. 1 is a plan view schematically showing a configuration of a semiconductor device of a first preferred embodiment.
Figure 2:
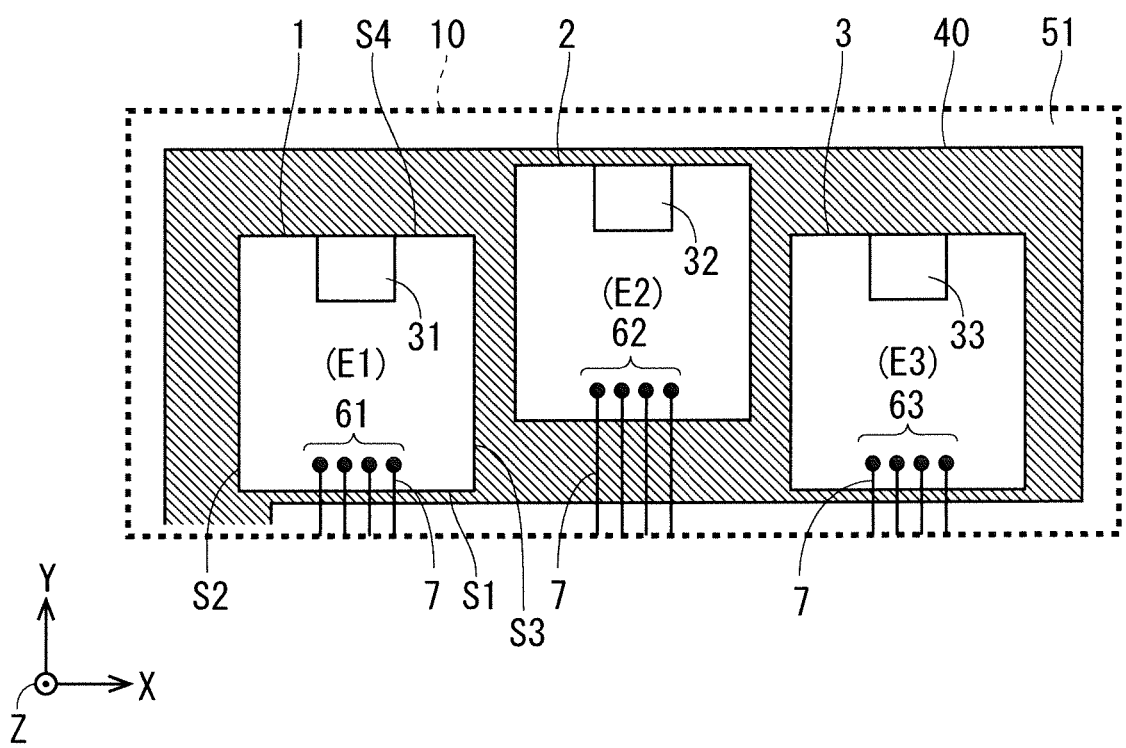
FIG. 2 is an enlarged plan view showing an upper arm RC-IGBT chip group in FIG. 1.

FIG. 1 is a plan view schematically showing a configuration of a semiconductor device 101 according to a first preferred embodiment of the present disclosure. FIG. 2 is an enlarged plan view showing an upper arm RC-IGBT chip group 10 in FIG. 1. FIG. 3 is a circuit diagram showing an equivalent circuit implemented with the six RC-IGBT chips 1 to 6 shown in FIG. 1. It should be noted that an XYZ orthogonal coordinate system is shown in each of FIGS. 1 and 2.

As shown in these drawings, the semiconductor device 101 includes a resin insulating substrate 51, RC-IGBT chips 1 to 6, copper circuit patterns 40 to 43 and 48, a P terminal 20, a U terminal 21, a V terminal 22, a W terminal 23, an N terminal 28, and a case 50 as main components.

The resin insulating substrate 51, the RC-IGBT chips 1 to 6, and the copper circuit patterns 40 to 43 and 48 are accommodated inside the case 50, and the P terminal 20, the U terminal 21, the V terminal 22, the W terminal 23, and the N terminal 28 are provided outside the case 50.

Each of the copper circuit patterns 40 to 43 and 48 functions as a single wiring board having conductivity as a whole, such as a metal electrode or a die pad.

In the case 50, copper circuit patterns 40 to 43 and 48 are provided on the resin insulating substrate 51. The copper circuit patterns 40 to 43 and 48 are electrically independent of each other.

The RC-IGBT chips 1 to 3 are arranged along the X direction being the first direction on the chip arrangement region of the copper circuit pattern 40. The copper circuit pattern 40 serves as a common circuit pattern for the RC-IGBT chips 1 to 3. The copper circuit pattern 40 has a chip arrangement region on the +Y side and an elongated relay region extending in the −Y direction from the chip arrangement region.

Furthermore, the RC-IGBT chip 4 is arranged on the chip arrangement region of the copper circuit pattern 41, the RC-IGBT chip 5 is arranged on the chip arrangement region of the copper circuit pattern 42, and the RC-IGBT chip 6 is arranged on the chip arrangement region of the copper circuit pattern 43.

Each of the copper circuit patterns 41 to 43 has a chip arrangement region on the +Y side, and a relay region bent in the −X direction from an end portion on the −Y side of the chip arrangement region and further extending in the −Y direction.

The copper circuit pattern 48 is provided to extend in the X direction on the −Y side of the relay region of the copper circuit pattern 43.

The RC-IGBT chips 1 to 3 arranged on the same copper circuit pattern 40 constitute an upper arm RC-IGBT chip group 10.

As shown in FIG. 3, each of the RC-IGBT chips i (i=any one of 1 to 6) has a combination of an N-channel IGBT $1i$ being a switching element and a diode $D1i$ being a reflux element. Specifically, the collector of the IGBT $1i$ is connected to the cathode of the diode $D1i$, and the emitter of the IGBT $1i$ is connected to the anode of the diode $D1i$. For example, in the RC-IGBT chip 1, the collector of the IGBT 11 is connected to the cathode of the diode D11, and the emitter of the IGBT 11 is connected to the anode of the diode D11.

As illustrated in FIG. 3, the RC-IGBT chips 1, 2, and 3 are used for the upper arms UP, VP, and WP of the three-phase AC inverter, and the RC-IGBT chips 4, 5, and 6 are used for the lower arms UN, VN, and WN of the three-phase AC inverter.

In FIGS. 1 and 2, most of the regions excluding the signal pads 31 to 36 on the upper surface of the RC-IGBT chips 1 to 6 serve as emitter electrodes being first main electrodes. For example, as shown in FIG. 2, most of the regions excluding the signal pads 31 to 33 on the upper surfaces of the RC-IGBT chips 1 to 3 serve as the emitter electrodes E1 to E3.

The lower surfaces of the RC-IGBT chips 1 to 6 serve as collector electrodes being second main electrodes. It should be noted that the emitter electrode also serves as the anode electrode of the diode $D1i$, and the collector electrode also serves as the cathode electrode of the diode $D1i$.

That is, each of the RC-IGBT chips 1 to 6 includes an IGBT $1i$ being a switching element, an emitter electrode serving as a first main electrode of the IGBT $1i$ is provided on the upper surface, and a collector electrode serving as a second main electrode of the IGBT $1i$ is provided on the lower surface.

Therefore, the collector electrode of each of the RC-IGBT chips 1 to 3 is commonly electrically connected to the copper circuit pattern 40, the collector electrode of the RC-IGBT chip 4 is electrically connected to the copper circuit pattern 41, the collector electrode of the RC-IGBT chip 5 is electrically connected to the copper circuit pattern 42, and the collector electrode of the RC-IGBT chip 6 is electrically connected to the copper circuit pattern 43. As described above, each of the copper circuit patterns 40 to 43 and 48 functions as a single wiring board.

Then, in each of the RC-IGBT chips 1 to 6, a part of the emitter electrode is allocated to a bonding point region $6i$ (i=any one of 1 to 6) being a wiring connection region. For example, a part of the emitter electrode E1 of the RC-IGBT chip 1 is allocated to the bonding point region 61. In FIGS. 1 and 2, a region including four black circles along the X direction serves as a bonding point region. Wires 7 serving as relay wires for external wiring line are bonded to each bonding point region.

The bonding point region of the end portion on the −Y side of the copper circuit pattern 40 and the bonding point region of the P terminal 20 are electrically connected through the four wires 7. That is, one end of each of the four wires 7 is bonded to the bonding point region of the copper circuit pattern 40, and the other end of each of the four wires 7 is bonded at the bonding point region of the P terminal 20.

As described above, including a case where the bonding point regions are electrically connected with the four wires 7, the connection is simply described as "The bonding point region of X and the bonding point region of Y are electrically connected through the wires 7." for convenience of description. It should be noted that X and Y respectively mean connection target members such as the copper circuit pattern 40 and the U terminal 21.

As shown in FIGS. 1 and 2, each of the RC-IGBT chips 1 to 6 shows a rectangular shape including first to fourth sides in a plan view. For example, as shown in the RC-IGBT chip 1 in FIG. 2, sides S1 to S4 exist as the first to fourth sides. That is, the first side is a side S1, the second side is a side S2, the third side is a side S3, and the fourth side is a side S4.

The bonding point region 61 of the RC-IGBT chip 1 is provided on the side S1 side among the sides S1 to S4 along the X direction, the sides S2 and S3 are sides adjacent to the side S1, and the side S4 is a side facing the side S1.

Similarly to the RC-IGBT chip 1, the bonding point regions 62 to 66 of the RC-IGBT chips 2 to 6 as well are provided on the sides S1 along the X direction.

As shown in FIG. 1, the bonding point region 61 of the RC-IGBT chip 1 and the bonding point region on the +Y side of the copper circuit pattern 41 are electrically connected through the wires 7, and the bonding point region on the −Y side of the copper circuit pattern 41 and the bonding point region 81 of the U terminal 21 are electrically connected through the wires 7.

Therefore, the wires 7 on the +Y side, the relay region of the copper circuit pattern 41, and the wires 7 on the −Y side provided between the bonding point region 61 of the RC-IGBT chip 1 and the bonding point region 81 of the U terminal 21 function as a first external wiring line electrically connecting the emitter electrode of the RC-IGBT chip 1 and the U terminal 21.

The bonding point region 62 of the RC-IGBT chip 2 and the bonding point region on the +Y side of the copper circuit pattern 42 are electrically connected through the wires 7, and the bonding point region on the −Y side of the copper circuit pattern 42 and the bonding point region 82 of the V terminal 22 are electrically connected through the wires 7.

Therefore, the wires 7 on the +Y side, the relay region of the copper circuit pattern 42, and the wires 7 on the −Y side provided between the bonding point region 62 of the RC-IGBT chip 2 and the bonding point region 82 of the V terminal 22 function as a second external wiring line electrically connecting the emitter electrode of the RC-IGBT chip 2 and the V terminal 22.

The bonding point region 63 of the RC-IGBT chip 3 and the bonding point region on the +Y side of the copper circuit pattern 43 are electrically connected through the wires 7, and the bonding point region on the −Y side of the copper circuit pattern 43 and the bonding point region 83 of the W terminal 23 are electrically connected through the wires 7.

Therefore, the wires 7 on the +Y side, the relay region of the copper circuit pattern 43, and the wires 7 on the −Y side provided between the bonding point region 63 of the RC-IGBT chip 3 and the bonding point region 83 of the W terminal 23 function as a third external wiring line electrically connecting the emitter electrode of the RC-IGBT chip 3 and the W terminal 23.

The first to third external wiring lines serving as a plurality of external wiring lines are formed to extend from the bonding point regions 61 to 63 of the RC-IGBT chips 1 to 3 being a plurality of semiconductor chips toward the −Y direction side. Thus, each of the first to third external wiring lines is electrically connected to the bonding point region of the corresponding chip among the RC-IGBT chips 1 to 3.

The bonding point region 64 of the RC-IGBT chip 4 and the bonding point region on the +Y side and the −X side of the copper circuit pattern 48 are electrically connected through the wires 7. Furthermore, the bonding point region 65 of the RC-IGBT chip 5 and the bonding point region on the +Y side and in the center of the copper circuit pattern 48 are electrically connected through the wires 7, and the bonding point region 66 of the RC-IGBT chip 6 and the bonding point region on the +Y side and the +X side of the copper circuit pattern 48 are electrically connected through the wires 7.

Then, the bonding point region on the −Y side of the copper circuit pattern 48 and the bonding point region of the N terminal 28 are electrically connected through the wires 7.

As described above, electrically connecting the RC-IGBT chips 1 to 6 and the external terminals 20 to 23 and 28 makes it possible to achieve the circuit configuration of the inverter for three-phase AC shown in the equivalent circuit in FIG. 3.

As shown in FIG. 2, the semiconductor device 101 of the first preferred embodiment includes an RC-IGBT chips 1 to 3 as a plurality of semiconductor chips arranged along the X direction on the copper circuit pattern 40.

Then, a pair of semiconductor chips adjacent to each other in the X direction being the first direction between the RC-IGBT chips 1 to 3 satisfies the first and second arrangement conditions described below.

It should be noted that the RC-IGBT chips 1 and 2 and the RC-IGBT chips 2 and 3 correspond to a pair of RC-IGBT chips adjacent to each other in the X direction between the RC-IGBT chips 1 to 3. The RC-IGBT chips 1 to 3 include bonding point regions 61 to 63 as a wiring connection region.

In the RC-IGBT chips 1 and 2, the bonding point region 61 and the bonding point region 62 are separately arranged without overlapping each other in the Y direction being the second direction perpendicular to the X direction. That is, the coordinate positions of the bonding point region 61 and the bonding point region 62 in the Y direction are different from each other without overlapping. Similarly, between the RC-IGBT chips 2 and 3, the bonding point region 62 and the bonding point region 63 are separately arranged without overlapping in the Y direction.

Therefore, the semiconductor device 101 of the first preferred embodiment satisfies the following first arrangement condition.

First arrangement condition . . . A condition that in a pair of semiconductor chips adjacent to each other in the X direction among the plurality of semiconductor chips, the wiring connection regions are separately arranged without overlapping each other in the Y direction.

In the Y direction, the RC-IGBT chips 1 and 2 are arranged to partially overlap so that a part of the emitter electrodes excluding the bonding point region 61 and the bonding point region 62 overlap. That is, with respect to a part of the emitter electrode excluding the bonding point region 61 and the bonding point region 62, there is a region where coordinate positions in the Y direction overlap. Similarly, in the Y direction, the RC-IGBT chips 2 and 3 are arranged to partially overlap so that a part of the emitter electrodes excluding the bonding point region 62 and the bonding point region 63 overlap.

Therefore, the semiconductor device 101 of the first preferred embodiment satisfies the following second arrangement condition.

Second arrangement condition . . . A condition that a pair of semiconductor chips adjacent to each other in the X direction among the plurality of semiconductor chips is arranged to partially overlap in the Y direction so that a part of the regions other than the wiring connection regions overlap.

It should be noted that regarding the pair of semiconductor chips described above, the degree of overlapping of the emitter electrodes in the Y direction is desirably half or more from the viewpoint of reducing the formation area.

The semiconductor device 101 of the first preferred embodiment satisfies the first arrangement condition described above with regard to the RC-IGBT chips 1 to 3 as a plurality of semiconductor chips. Therefore, the distance between the bonding point regions 61 and 62 in the RC-IGBT chips 1 and 2 can be increased to suppress thermal interference between the RC-IGBT chips 1 and 2. Similarly, the distance between the bonding point regions 62 and 63 in the RC-IGBT chips 2 and 3 can be increased to suppress thermal interference between the RC-IGBT chips 2 and 3.

That is, since the semiconductor device 101 of the first preferred embodiment satisfies the above-described first arrangement condition, the distance between the wiring connection regions in the pair of semiconductor chips can be increased to suppress thermal interference between the pair of semiconductor chips.

The RC-IGBT chips 1 to 3 generate heat from the bonding point regions 61 to 63 for bonding the wires 7, and their peripheries. In consideration of this point, each of the distance between the bonding point regions 61 and 62 in the pair of RC-IGBT chips 1 and 2 adjacent in the X direction and the distance between the bonding point regions 62 and 63 in the RC-IGBT chips 2 and 3 is increased.

As a result, in the semiconductor device 101 of the first preferred embodiment, suppressing thermal interference between a pair of RC-IGBT chips adjacent in the X direction makes it possible to suppress a temperature rise inside the RC-IGBT chips 1 to 3 being a plurality of semiconductor chips, and to prolong the life of the device.

Furthermore, the semiconductor device 101 of the first preferred embodiment satisfies the second arrangement condition described above with regard to the RC-IGBT chips 1 to 3 as a plurality of semiconductor chips. Therefore, in the semiconductor device 101, the formation area of the RC-IGBT chips 1 to 3 provided on the copper circuit pattern 40 being the common circuit pattern can be reduced, and the device can be miniaturized.

In addition, since the RC-IGBT chips 1 and 3 not adjacent to each other in the X direction are arranged to overlap each other so as to entirely overlap each other including the bonding point regions 61 and 63 in the Y direction, the formation area of the RC-IGBT chips 1 to 3 can be reduced to the minimum necessary. In the example shown in FIGS. 1 and 2, the positions of the sides S1 in the Y direction are made to coincide between the RC-IGBT chips 1 and 3.

As described above, the semiconductor device 101 of the first preferred embodiment can simultaneously achieve prolonging life and reducing size of the device.

That is, in the semiconductor device 101 including the RC-IGBT chips 1 to 3, each of which includes a combination of an IGBT and a diode and is used for the upper arm of the inverter, it is possible to achieve miniaturization and long life of the device.

Second Preferred Embodiment

Figure 4:
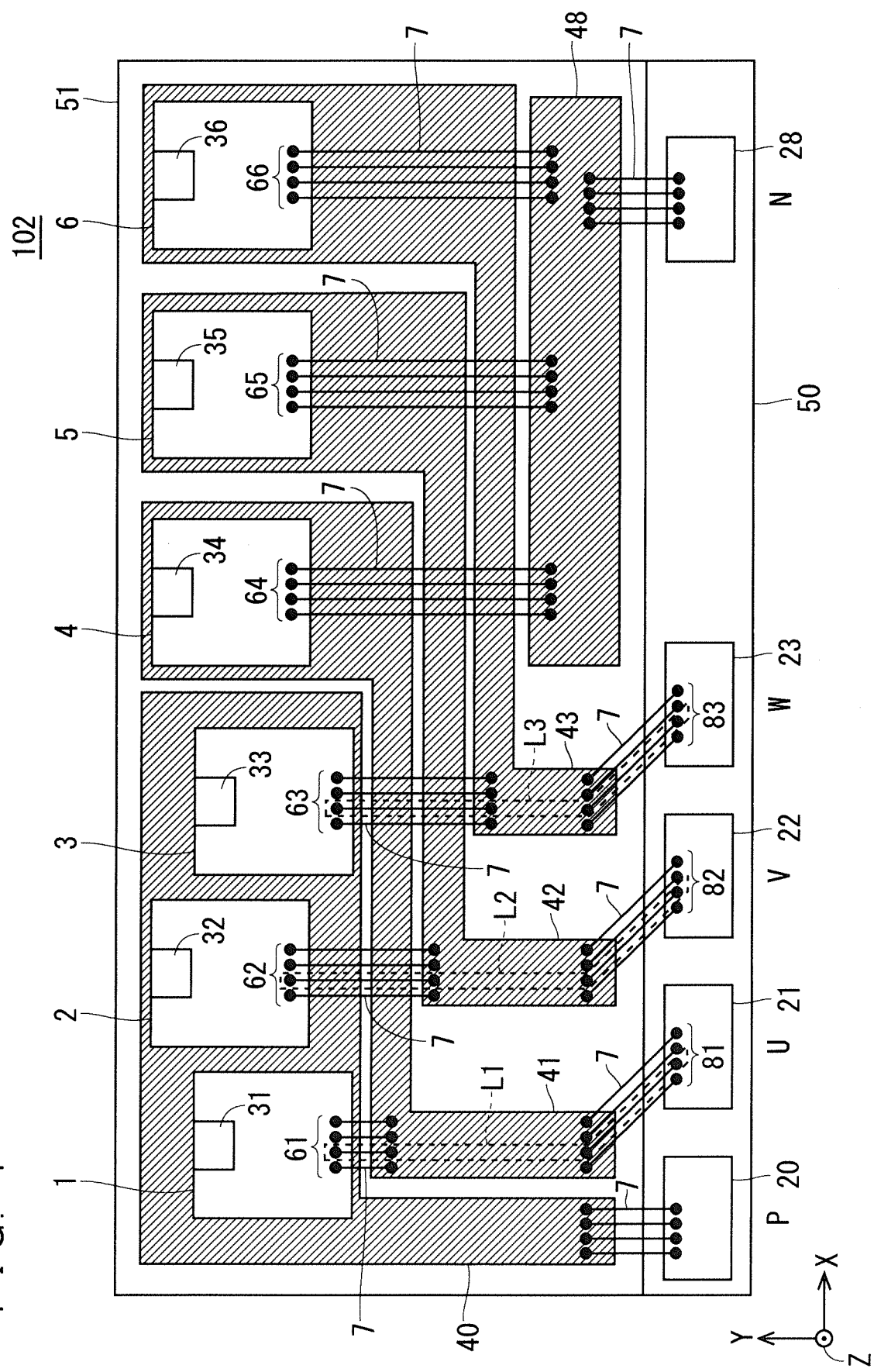
FIG. 4 is a plan view schematically showing a configuration of a semiconductor device of a second preferred embodiment.

FIG. 4 is a plan view schematically showing a configuration of a semiconductor device 102 according to a second preferred embodiment of the present disclosure. An XYZ orthogonal coordinate system is shown in FIG. 4.

Hereinafter, the same configurations as those of the semiconductor device 101 of the first preferred embodiment shown in FIGS. 1 to 3 will be denoted by the same reference numerals, description thereof will be omitted as appropriate, and a characteristic portion of the semiconductor device 102 of the second preferred embodiment will be mainly described. It should be noted that as in the first preferred embodiment, the semiconductor device 102 also achieves an equivalent circuit shown in FIG. 3.

As shown in FIG. 4, in the semiconductor device 102 of the second preferred embodiment, as in the first preferred embodiment, bonding point regions 61 to 66 serving as wiring connection regions are provided along the X direction on the first-side side on the −Y side of the RC-IGBT chips 1 to 6.

The bonding point region 61 of the RC-IGBT chip 1 and the bonding point region on the +Y side of the copper circuit pattern 41 are electrically connected through the wires 7, and the bonding point region on the −Y side of the copper circuit pattern 41 and the bonding point region 81 of the U terminal 21 are electrically connected through the wires 7.

Therefore, the electrical connection portion including the wires 7 on the +Y side, the relay region of the copper circuit pattern 41, and the wires 7 on the −Y side provided between the bonding point region 61 of the RC-IGBT chip 1 and the bonding point region 81 of the U terminal 21 serves as the external wiring line L1. The external wiring line L1 functions as a first external wiring line that electrically connects the emitter electrode of the RC-IGBT chip 1 and the U terminal 21.

The bonding point region 62 of the RC-IGBT chip 2 and the bonding point region on the +Y side of the copper circuit pattern 42 are electrically connected through the wires 7, and the bonding point region on the −Y side of the copper circuit pattern 42 and the bonding point region 82 of the V terminal 22 are electrically connected through the wires 7.

Therefore, the electrical connection portion including the wires 7 on the +Y side, the relay region of the copper circuit pattern 42, and the wires 7 on the −Y side provided between the bonding point region 62 of the RC-IGBT chip 2 and the bonding point region 82 of the V terminal 22 serves as the external wiring line L2. The external wiring line L2 functions as a second external wiring line that electrically connects the emitter electrode of the RC-IGBT chip 2 and the V terminal 22.

The bonding point region 63 of the RC-IGBT chip 3 and the bonding point region on the +Y side of the copper circuit pattern 43 are electrically connected through the wires 7, and the bonding point region on the −Y side of the copper circuit pattern 43 and the bonding point region 83 of the W terminal 23 are electrically connected through the wires 7.

Therefore, the electrical connection portion including the wires 7 on the +Y side, the relay region of the copper circuit pattern 43, and the wires 7 on the −Y side provided between the bonding point region 63 of the RC-IGBT chip 3 and the bonding point region 83 of the W terminal 23 serves as the external wiring line L3. The external wiring line L3 functions as a third external wiring line that electrically connects the emitter electrode of the RC-IGBT chip 3 and the W terminal 23.

The RC-IGBT chips 1 to 3 being a plurality of semiconductor chips are classified into two, serving as a first number, RC-IGBT chips 1 and 3, and one, serving as a second number, RC-IGBT chip 2. The RC-IGBT chips 1 and 3 are classified into first type semiconductor chips, and the RC-IGBT chip 2 is classified into a second type semiconductor chip.

Therefore, the RC-IGBT chips 1 and 3 being a first number of first type semiconductor chips and the RC-IGBT chips 2 being a second number of second type semiconductor chips are alternately arranged along the X direction, being the first direction. The first number is "2", the second number is "1", and there is a numerical characteristic that "the first number is the second number or more".

Then, two terminals of the U terminal 21 and W terminal 23 for the RC-IGBT chips 1 and 3 are classified into first type external terminals, and one terminal of the V terminal 22 for the RC-IGBT chip 2 is classified into a second type external terminal.

Therefore, the external wiring lines L1 and L3 electrically connecting the bonding point regions 61 and 63 of the RC-IGBT chips 1 and 3 and the bonding point regions 81 and 83 of the U terminal 21 and the W terminal 23 are classified into two first-type external wiring lines. Furthermore, the external wiring line L2 electrically connecting the bonding point region 62 of the RC-IGBT chip 2 and the bonding point region 82 of the V terminal 22 is classified into a second number of second type external wiring lines.

Thus, in the second preferred embodiment, the external wiring lines L1 to L3 being a plurality of external wiring lines include two external wiring lines L1 and L3 and one external wiring line L2. The external wiring lines L1 and L3 serve as first type external wiring lines for the RC-IGBT chips 1 and 3 classified into first type semiconductor chips, and the external wiring line L2 serves as an external wiring line for the RC-IGBT chip 2 classified into a second type semiconductor chip.

Then, the semiconductor device 102 of the second preferred embodiment is characterized in that both the wiring lengths of the two external wiring lines L1 and L3 are set to be shorter than the wiring length of the one external wiring line L2.

That is, the semiconductor device 102 of the second preferred embodiment satisfies the wiring length condition that the wiring lengths of a first number of first type external wiring lines are shorter than the wiring lengths of a second number of second type external wiring lines.

The semiconductor device 102 of the second preferred embodiment satisfies the wiring length condition that the wiring lengths of the external wiring lines L1 to L3 are set so that the wiring lengths of the two external wiring lines L1 and L3 are both shorter than the wiring length of the one external wiring line L2. Furthermore, with respect to the first number "2" and the second number "1", there is a numerical characteristic that "the first number is the second number or more".

Therefore, in the semiconductor device 102, by making the wiring lengths of two external wiring lines L1 and L3, that is, at least half or more the external wiring lines L1 to L3, shorter than the wiring length of the one external wiring line L2, the wiring impedances in the external wiring lines L1 and L3 of the two RC-IGBT chips 1 and 3 can be relatively reduced as compared with the wiring impedance of the one external wiring line L2.

As a result, in the semiconductor device 102 of the second preferred embodiment, the temperature rise of the two external wiring lines L1 and L3 electrically connected to the two RC-IGBT chips 1 and 3 can be suppressed, and the life of the device can be prolonged.

It should be noted that the semiconductor device 102 of the second preferred embodiment can be extended to satisfy the above wiring length condition even in four or more semiconductor chips. However, when the number of semiconductor chips is an even number, the first number is equal to the second number. Therefore, in the extended configuration of the semiconductor device 102, when the number of semiconductor chips is an even number, there produces an effect of relatively reducing the wiring impedance of the first type external wiring lines being half of the plurality of external wiring lines.

Third Preferred Embodiment

Figure 5:
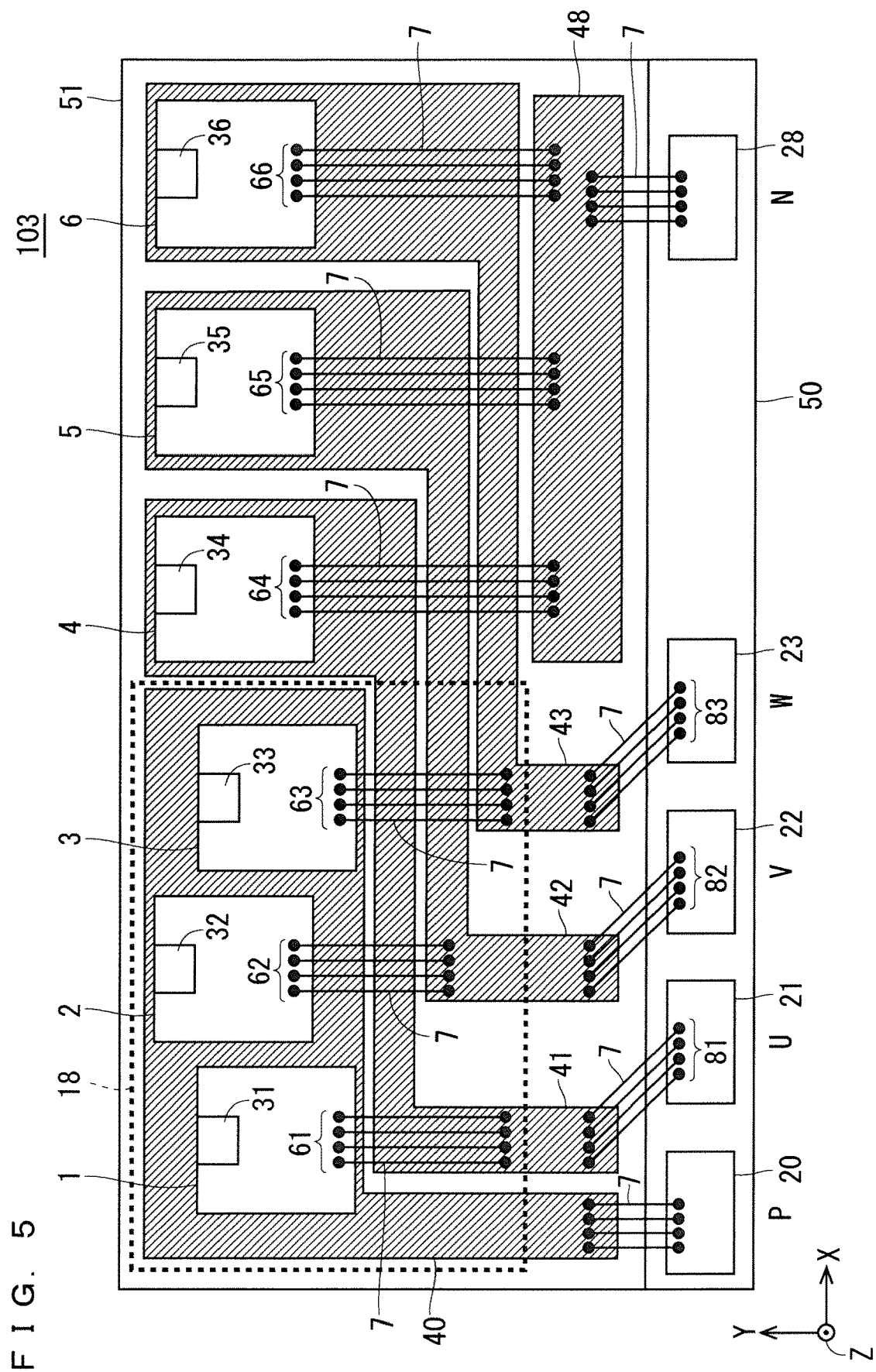
FIG. 5 is a plan view schematically showing a configuration of a semiconductor device of a third preferred embodiment.

FIG. 5 is a plan view schematically showing a configuration of a semiconductor device 103 according to a third preferred embodiment of the present disclosure. FIG. 6 is an enlarged plan view showing the RC-IGBT chips 1 to 3 and the periphery of three wires 7 bonded to the bonding point regions 61 to 63, in FIG. 5. An XYZ orthogonal coordinate system is shown in each of FIGS. 5 and 6.

Hereinafter, the same configurations as those of the semiconductor device 101 of the first preferred embodiment will be denoted by the same reference numerals, description thereof will be omitted as appropriate, and a characteristic portion of the semiconductor device 103 of the third preferred embodiment will be mainly described. It should be noted that as in the first preferred embodiment, the semiconductor device 103 also achieves an equivalent circuit shown in FIG. 3.

As shown in FIGS. 5 and 6, in the semiconductor device 103 of the third preferred embodiment, as in the first preferred embodiment, bonding point regions 61 to 66 serving as wiring connection regions are provided along the X direction on the first-side side on the −Y side of the RC-IGBT chips 1 to 6.

The copper circuit patterns 41 to 43 serving as a plurality of relay terminals functions as a part of a plurality of external wiring lines electrically connecting the RC-IGBT chips 1 to 3 to the U terminal 21, the V terminal 22, and the W terminal 23. It should be noted that the copper circuit patterns 41 to 43 are electrically independent of each other. That is, there is no electrical connection relationship between the copper circuit patterns 41 to 43.

The bonding point region 61 of the RC-IGBT chip 1 and the bonding point region on the +Y side of the copper circuit pattern 41 are electrically connected through the wires 7, and the bonding point region on the −Y side of the copper circuit pattern 41 and the bonding point region 81 of the U terminal 21 are electrically connected through the wires 7. The formation position of the bonding point region on the +Y side of the copper circuit pattern 41 is changed to the −Y side as compared with that of the first preferred embodiment.

Therefore, the electrical connection portion including the wires 7 on the +Y side, the relay region of the copper circuit pattern 41, and the wires 7 on the −Y side provided between the bonding point region 61 of the RC-IGBT chip 1 and the bonding point region 81 of the U terminal 21 serves as a first external wiring line. The first external wiring line corresponds to the external wiring line L1 of the second preferred embodiment shown in FIG. 4. As shown in FIG. 6, the wires 7(1) electrically connecting the bonding point region 61 of the RC-IGBT chip 1 and the bonding point region of the copper circuit pattern 41 function as first relay wires. The wires 7(1) serve as a part of the first external wiring line.

The bonding point region 62 of the RC-IGBT chip 2 and the bonding point region on the +Y side of the copper circuit pattern 42 are electrically connected through the wires 7, and the bonding point region on the −Y side of the copper circuit pattern 42 and the bonding point region 82 of the V terminal 22 are electrically connected through the wires 7.

Therefore, the electrical connection portion including the wires 7 on the +Y side, the relay region of the copper circuit pattern 42, and the wires 7 on the −Y side provided between the bonding point region 62 of the RC-IGBT chip 2 and the bonding point region 82 of the V terminal 22 serves as a second external wiring line. The second external wiring line corresponds to the external wiring line L2 shown in FIG. 4. As shown in FIG. 6, the wires 7(2) electrically connecting the bonding point region 62 of the RC-IGBT chip 2 and the bonding point region of the copper circuit pattern 42 function as second relay wires. The wires 7(2) serve as a part of the second external wiring line.

The bonding point region 63 of the RC-IGBT chip 3 and the bonding point region on the +Y side of the copper circuit pattern 43 are electrically connected through the wires 7, and the bonding point region on the −Y side of the copper circuit pattern 43 and the bonding point region 83 of the W terminal 23 are electrically connected through the wires 7.

Therefore, the electrical connection portion including the wires 7 on the +Y side, the relay region of the copper circuit pattern 43, and the wires 7 on the −Y side provided between the bonding point region 63 of the RC-IGBT chip 3 and the bonding point region 83 of the W terminal 23 serves as a third external wiring line. The third external wiring line corresponds to the external wiring line L3 shown in FIG. 4. As shown in FIG. 6, the wires 7(3) electrically connecting the bonding point region 63 of the RC-IGBT chip 3 and the bonding point region of the copper circuit pattern 43 function as third relay wires. The wires 7(3) serve as a part of the third external wiring line.

Thus, the first to third external wiring lines being the plurality of external wiring lines include the copper circuit patterns 41 to 43 being the plurality of relay terminals and the wires 7(1) to 7(3) being the plurality of relay wires. The copper circuit patterns 41 to 43 are provided corresponding to the RC-IGBT chips 1 to 3 being a plurality of semiconductor chips.

As shown in FIG. 6, the semiconductor device 103 of the third preferred embodiment has a characteristic in which the wiring lengths d1 to d3 of the wires 7(1) to 7(3) being a plurality of relay wires are set to be the same, that is, "d1=d2=d3".

In the semiconductor device 103 of the third preferred embodiment, since the wiring lengths d1 to d3 of the wires 7(1) to 7(3) connected between the RC-IGBT chips 1 to 3 and the copper circuit patterns 41 to 43 are set to be the same, the wiring impedances of the wires 7(1) to 7(3) of the copper circuit patterns 41 to 43 can be coincided with each other.

As a result, in the semiconductor device 103 of the third preferred embodiment, the current balance can be matched between the RC-IGBT chips 1 to 3, and the convenience of the device can be improved.

It should be noted that the wiring lengths d1 to d3 of the wires 7(1) to 7(3) being the same means the identity to such an extent that there is no significant difference in wiring impedance between the wires 7(1) to 7(3). In addition, the number of wires 7 is desirably the same among the wires 7(1) to 7(3).

When the current balance between the RC-IGBT chips 1 to 3 is not uniform and there is a locally weak portion, it is necessary to adjust the drive capability on the drive circuit side of the semiconductor device.

On the other hand, in the semiconductor device 103 of the third preferred embodiment, since the current balance is uniform between the RC-IGBT chips 1 to 3, improvement in convenience can be expected in that it is not necessary to adjust the drive capability on the drive circuit side of the semiconductor device 103.

Fourth Preferred Embodiment (Basic Configuration)

Figure 7:
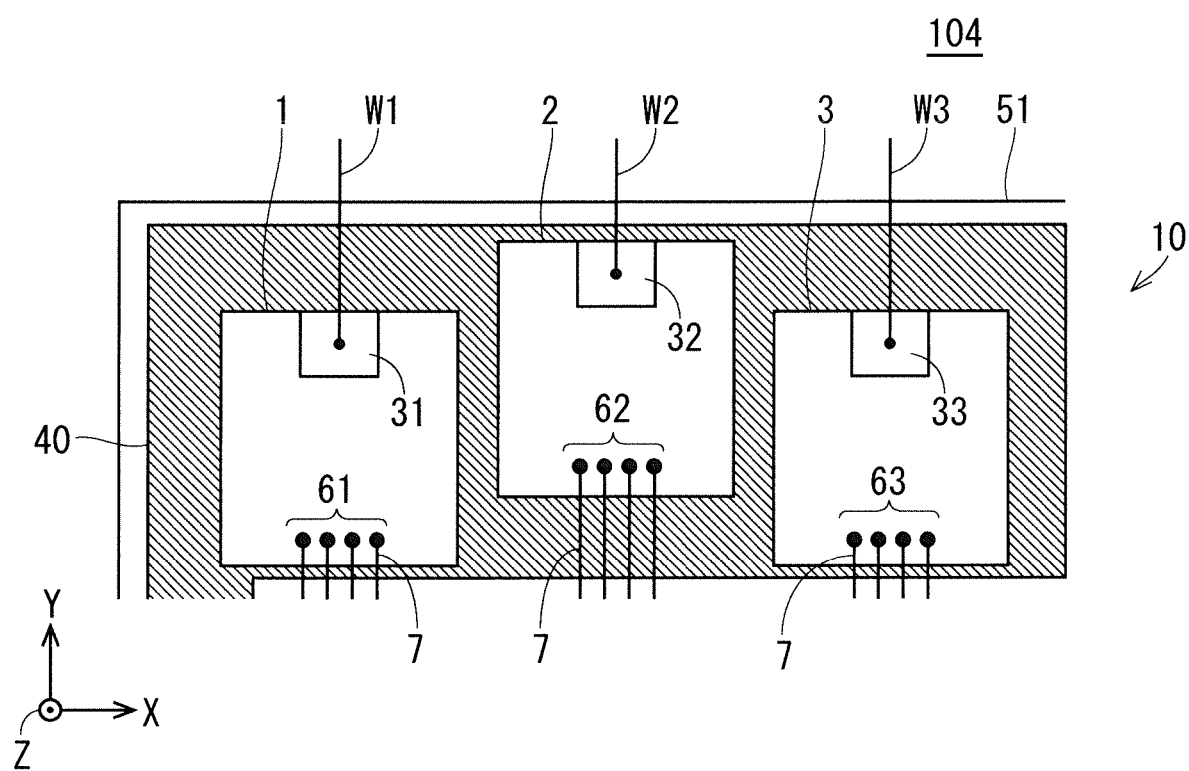
FIG. 7 is a plan view schematically showing a configuration of a semiconductor device of a fourth preferred embodiment.

FIG. 7 is a plan view schematically showing a basic configuration of a semiconductor device 104 according to a fourth preferred embodiment of the present disclosure. An XYZ orthogonal coordinate system is shown in FIG. 7.

Hereinafter, the same configurations as those of the semiconductor device 101 of the first preferred embodiment will be denoted by the same reference numerals, description thereof will be omitted as appropriate, and a characteristic portion of the semiconductor device 104 of the fourth preferred embodiment will be mainly described. It should be noted that as in the first preferred embodiment, the semiconductor device 104 also achieves an equivalent circuit shown in FIG. 3.

As shown in FIG. 7, in a semiconductor device 104 being a basic example of the fourth preferred embodiment, signal pads 31 to 33 functioning as control electrodes are provided on the fourth-side side on the +Y side of the RC-IGBT chips 1 to 3.

Bonding the tips of the signal wiring lines W1 to W3 on the signal pads 31 to 33 electrically connects the signal wiring lines W1 to W3 to the signal pads 31 to 33. Therefore, the signal wiring lines W1 to W3 function as a plurality of control wiring lines, and the signal pads 31 to 33 function as control electrodes of the IGBTs 11 to 13.

As shown in FIG. 7, the signal wiring lines W1 to W3 are provided to extend in the +Y direction from the signal pads 31 to 33. That is, the control wiring direction with the signal wiring lines W1 to W3 is set to the +Y direction.

On the other hand, as in the first to third preferred embodiments, also in the semiconductor device 104 of the fourth preferred embodiment, the first to third external wiring lines serving as a plurality of external wiring lines are formed to extend from the bonding point regions 61 to 63 of the RC-IGBT chips 1 to 3 being a plurality of semiconductor chips toward the −Y direction side. That is, the external wiring direction with the first to third external wiring lines is set to the −Y direction.

In the semiconductor device 104 of the fourth preferred embodiment, the control wiring direction of the signal wiring lines W1 to W3 is the +Y direction, and the external wiring direction of the first to third external wiring lines is the −Y direction. Therefore, the control wiring direction of the signal wiring lines W1 to W3 and the external wiring direction of the first to third external wiring lines are set in opposite directions away from each other.

In the semiconductor device 104 of the fourth preferred embodiment, since the control wiring direction of the signal wiring lines W1 to W3 and the external wiring direction of the plurality of external wiring lines are set to be opposite directions, it is possible to provide the plurality of external wiring lines by suppressing interference from the signal wiring lines W1 to W3, and it is possible to increase the degree of freedom of installing the plurality of external wiring lines.

As a result, in the semiconductor device 104 of the fourth preferred embodiment, since the number of wires 7 serving as relay wires used for a plurality of external wiring lines can be increased, the wiring impedance and the wiring inductance regarding the plurality of external wiring lines can be suppressed, and thus, the life of the device can be extended.

(Modification)

Figure 8:
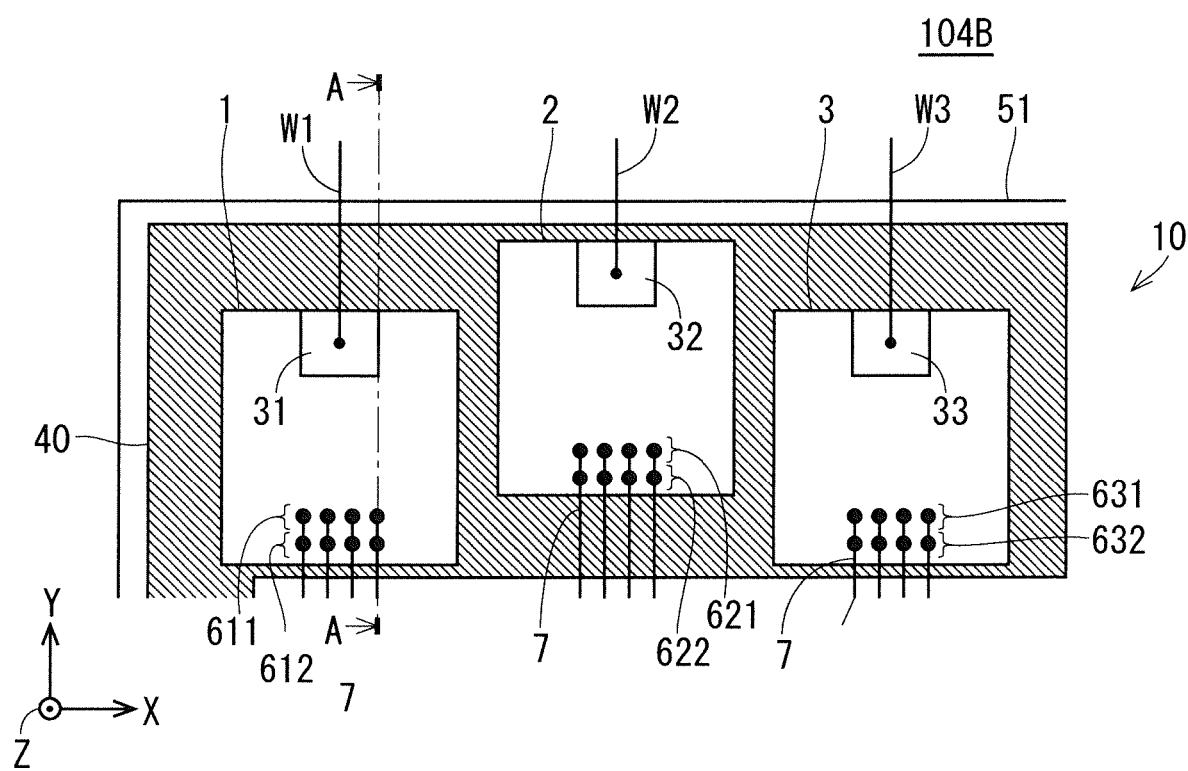
FIG. 8 is a plan view schematically showing a configuration of a modification of the fourth preferred embodiment.
Figure 9:
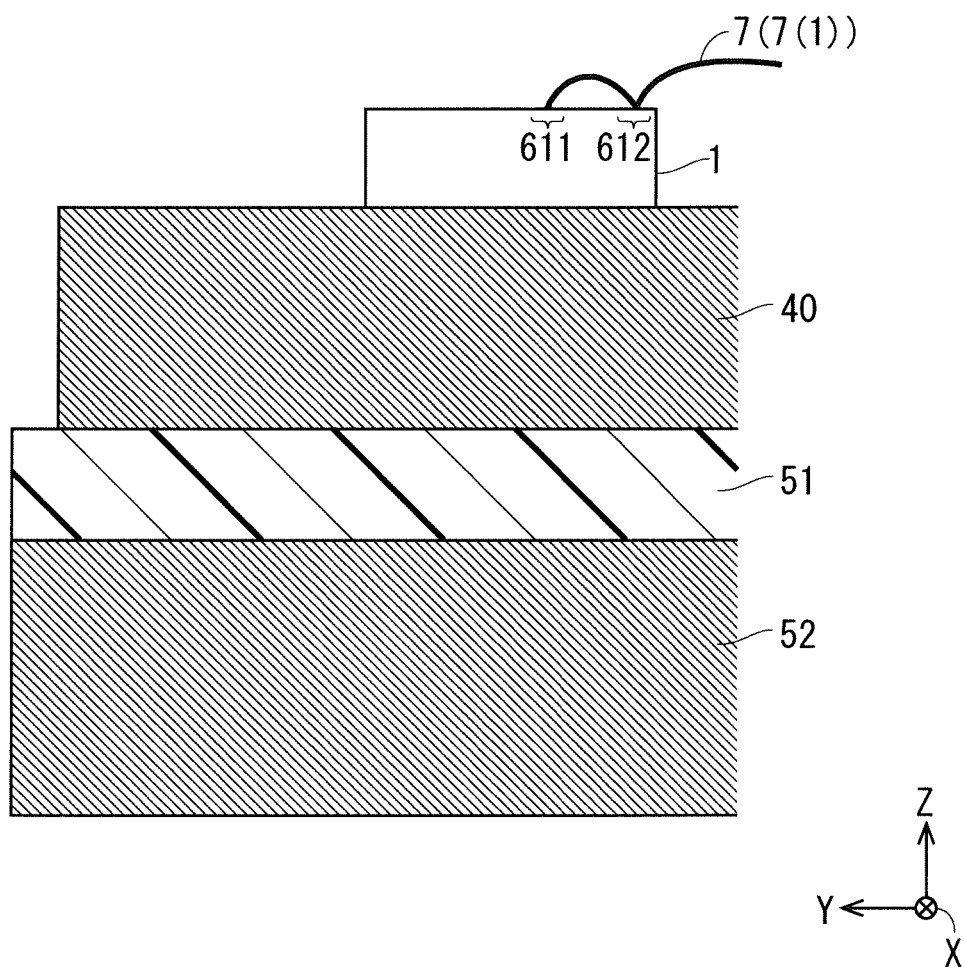
FIG. 9 is a cross-sectional view showing a cross-sectional structure taken along line A-A in FIG. 8.

FIG. 8 is a plan view schematically showing a configuration of a semiconductor device 104B being a modification of the fourth preferred embodiment of the present disclosure. FIG. 9 is a cross-sectional view showing a cross-sectional structure taken along line A-A in FIG. 8. An XYZ orthogonal coordinate system is shown in each of FIGS. 8 and 9.

Hereinafter, the same configurations as those of the semiconductor device 101 of the first preferred embodiment will be denoted by the same reference numerals, description thereof will be omitted as appropriate, and a characteristic portion of the semiconductor device 104B being a modification of the fourth preferred embodiment will be mainly described. It should be noted that as in the first preferred embodiment, the semiconductor device 104B of the modification also achieves an equivalent circuit shown in FIG. 3.

As shown in FIG. 8, as in the basic example of the fourth preferred embodiment, in the semiconductor device 104B of the modification, signal pads 31 to 33 functioning as control electrodes are provided on the fourth-side side on the +Y side of the RC-IGBT chips 1 to 6.

Then, as shown in FIG. 7, the signal wiring lines W1 to W3 are provided to extend in the +Y direction from the signal pads 31 to 33. That is, the control wiring direction with the signal wiring lines W1 to W3 is set to the +Y direction.

On the other hand, as in the first to third preferred embodiments, also in the semiconductor device 104B of the fourth preferred embodiment, the first to third external wiring lines serving as a plurality of external wiring lines are formed to extend from the bonding point regions 61 to 63 of the RC-IGBT chips 1 to 3 being a plurality of semiconductor chips toward the −Y direction side. That is, the external wiring direction with the first to third external wiring lines is set to the −Y direction.

In the semiconductor device 104B of the modification, as with the semiconductor device 104 of the basic configuration, the control wiring direction of the signal wiring lines W1 to W3 and the external wiring direction of the first to third external wiring lines are set in opposite directions away from each other.

Therefore, as with the semiconductor device 104, the semiconductor device 104B being the modification produces an effect of extending the life of the device.

Furthermore, the semiconductor device 104B has the following unique characteristics.

The RC-IGBT chip 1 has a bonding point region 611 being a first separation wiring connection region and a bonding point region 612 being a second separation wiring connection region as a wiring connection region. The bonding point regions 611 and 612 are provided separately from each other along the Y direction being the second direction. Thus, the first and second separation wiring connection regions serve as a part of the wiring connection region.

As shown in FIG. 9, an end portion of the wires 7(1) serving as a relay wire for the RC-IGBT chip 1 is bonded to the bonding point region 611, and an intermediate portion of the wires 7(1) is bonded to the bonding point region 612. That is, the wires 7(1) are bonded to the emitter electrode of the RC-IGBT chip 1 at two places of the bonding point regions 611 and 612. Hereinafter, such a structure in which wires are connected to the emitter electrode at a plurality of positions may be referred to as a "stitch structure of wires".

It should be noted that as shown in FIG. 9, the semiconductor device 104B further includes a resin insulating substrate 51 on whose upper surface the copper circuit pattern 40 is provided, and a base plate 52 on whose upper surface the resin insulating substrate 51 is provided. It should be noted that the basic configurations of the first to third and fourth preferred embodiments also have a cross-sectional structure as in FIG. 9 except for the stitch structure of the wires.

The RC-IGBT chip 2 has a bonding point region 621 being a first separation wiring connection region and a bonding point region 622 being a second separation wiring connection region as a wiring connection region. The bonding point regions 621 and 622 are provided separately from each other along the Y direction.

Although not shown, the wires 7(2) serving as relay wires for the RC-IGBT chip 2 are also bonded at two places of the bonding point regions 621 and 622, as with the wires 7(1).

The RC-IGBT chip 3 has a bonding point region 631 being a first separation wiring connection region and a bonding point region 632 being a second separation wiring connection region as a wiring connection region. The bonding point regions 631 and 632 are provided separately from each other along the Y direction.

Although not shown, the wires 7(3) serving as relay wires for the RC-IGBT chip 3 are also bonded at two places of the bonding point regions 631 and 632, as with the wires 7(1).

As described above, the semiconductor device 104B being the modification has the following characteristics. Each of the wiring connection regions of the RC-IGBT chips 1 to 3 includes first and second separation wiring connection regions provided separately along the Y direction.

Then, the relay wires serving as a part of each of the plurality of external wiring lines are electrically connected to the first separation wiring connection region and the second separation wiring connection region.

In the semiconductor device 104B of the modification, since the wiring connection region of each of the RC-IGBT chips 1 to 3 includes the first and second separation wiring connection regions, the area of the wiring connection region of each of the RC-IGBT chips 1 to 3 can be increased, so that the current density flowing from the emitter electrode serving as the first main electrode to the external wiring line can be reduced.

As a result, the semiconductor device 104B serving as the modification of the fourth preferred embodiment can suppress the temperature rise in the bonding point region serving as the wiring connection region of each of the RC-IGBT chips 1 to 3 to extend the life of the device.

It should be noted that in the modification, joints at two places are shown as the stitch structure of the wires, but it is of course possible to extend to joints at three or more places.

Fifth Preferred Embodiment

Figures 10A, 10B:
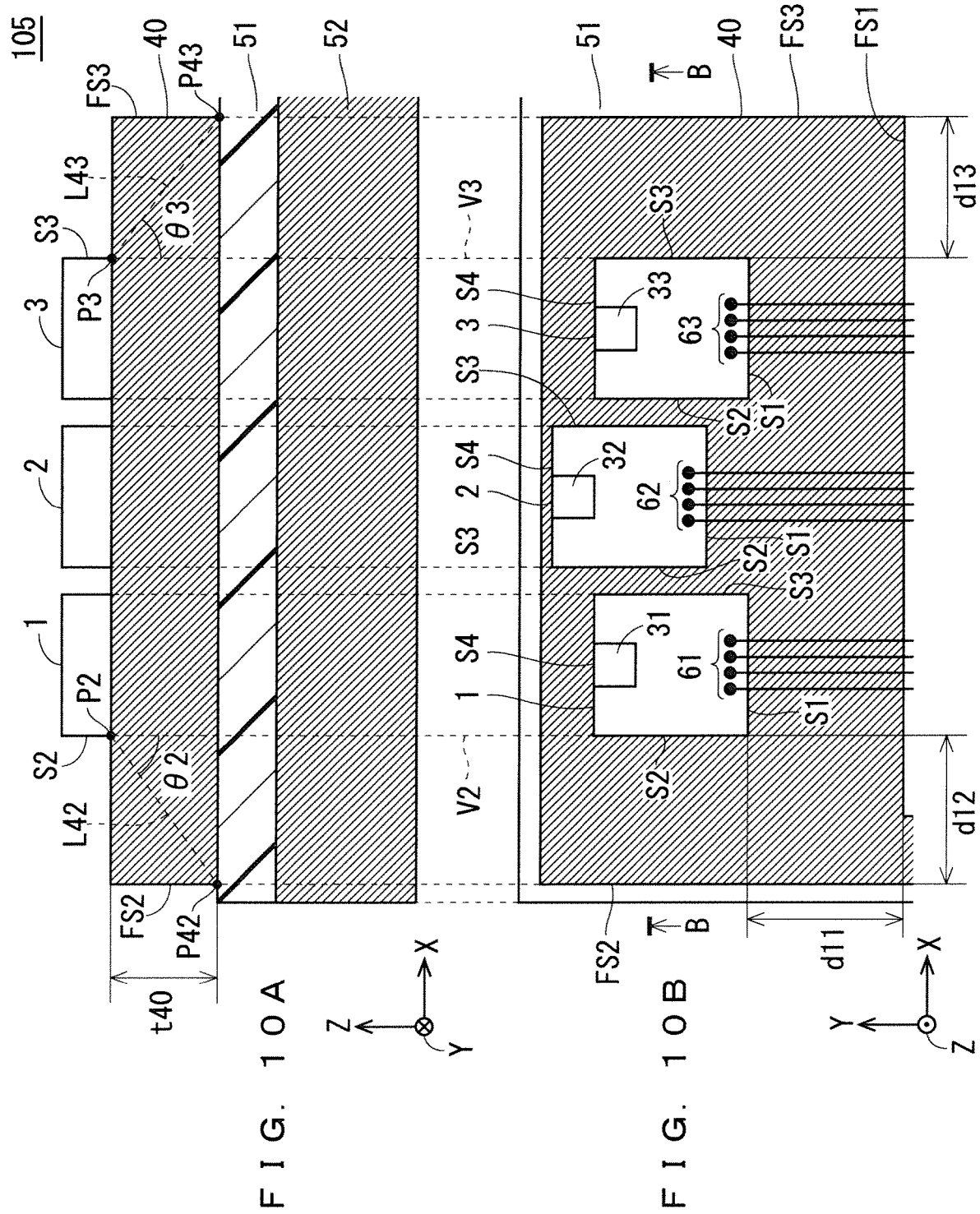
FIGS. 10A and 10B are explanatory diagrams schematically showing a configuration of a semiconductor device of a fifth preferred embodiment.

FIGS. 10A and 10B are explanatory diagrams schematically showing a configuration of a semiconductor device 105 being a fifth preferred embodiment of the present disclosure. FIG. 10A is a cross-sectional view, and FIG. 10B is a plan view. FIG. 10A shows a cross section taken along line B-B in FIG. 10B. An XYZ orthogonal coordinate system is shown in each of FIGS. 10A and 10B.

Hereinafter, the same configurations as those of the semiconductor device 101 of the first preferred embodiment will be denoted by the same reference numerals, description thereof will be omitted as appropriate, and a characteristic portion of the semiconductor device 105 of the fifth preferred embodiment will be mainly described. It should be noted that as in the first preferred embodiment, the semiconductor device 105 also achieves an equivalent circuit shown in FIG. 3.

As shown in FIG. 10A, the semiconductor device 105 further includes a resin insulating substrate 51 and a base plate 52, the resin insulating substrate 51 is provided on the base plate 52, and the copper circuit pattern 40 is provided on the resin insulating substrate 51. It should be noted that the lower surface of the copper circuit pattern 40 is entirely positioned on the upper surface of the resin insulating substrate 51. That is, the resin insulating substrate 51 includes a region including the entire copper circuit pattern 40 in a plan view.

Thus, the semiconductor device 105 further includes a resin insulating substrate 51 being an insulating substrate on whose upper surface a copper circuit pattern 40 being a common circuit pattern is provided. Then, the film thickness of the copper circuit pattern 40 is set to the thickness t40.

As shown in FIG. 10B, each of the RC-IGBT chips 1 to 3 has a rectangular shape having sides S1 to S4 being the first to fourth sides in a plan view. Each of the bonding point regions 61 to 63 of the RC-IGBT chips 1 to 3 is provided on the side S1 side among the sides S1 to S4 along the X direction, the sides S2 and S3 are sides adjacent to the side S1, and the side S4 is a side facing the side S1.

It should be noted that the respective formation directions of the sides S1 to S4 are coincident with each other between the RC-IGBT chips 1 to 3. That is, the formation directions of the sides S1 and S4 are the X direction, and the formation directions of the sides S2 and S3 are the Y direction.

In addition, the planar shapes of the RC-IGBT chips 1 to 3 are all the same. The characteristics are also the same in the first to fourth preferred embodiments, and in the sixth and subsequent preferred embodiments described below.

The copper circuit pattern 40 being a common circuit pattern has opposite sides FS1 to FS3 being the first to third opposite sides opposite to the sides S1 to S3 in a plan view. That is, the first opposite side serves as the opposite side FS1, the second opposite side serves as the opposite side FS2, and the third opposite side serves as the opposite side FS3.

Then, the formation direction of the opposite side FS1 serves as the X direction identical to the formation direction of the side S1, and the formation direction of each of the opposite sides FS2 and FS3 serves as the Y direction identical to the sides S2 and S3.

The following first to third margin distances are defined between the RC-IGBT chips 1 to 3 and the copper circuit pattern 40 in the semiconductor device 105.

First margin distance . . . Let the shortest distance among the three first distances from the side S1 of each of the RC-IGBT chips 1 to 3 to the opposite side FS1 of the copper circuit pattern 40 be a margin distance d11. The margin distance d11 serves as a first margin distance.

In the planar configuration shown in FIG. 10B, a first distance from the side S1 of the RC-IGBT chip 1 to the opposite side FS1 of the copper circuit pattern 40 among the three first distances serving as the plurality of first distances serves as the margin distance d11. The margin distance d11 is the same length as the first distance from the side S1 of the RC-IGBT chip 3 to the opposite side FS1 of the copper circuit pattern 40.

Second margin distance . . . Let the shortest distance among the three second distances from the side S2 of each of the RC-IGBT chips 1 to 3 to the opposite side FS2 of the copper circuit pattern 40 be a margin distance d12. The margin distance d12 serves as a second margin distance.

In the planar configuration shown in FIG. 10B, a second distance from the side S2 of the RC-IGBT chip 1 to the opposite side FS2 of the copper circuit pattern 40 among the three second distances serving as the plurality of second distances serves as the margin distance d12.

Third margin distance . . . Let the shortest distance among the three third distances from the side S3 of each of the RC-IGBT chips 1 to 3 to the opposite side FS3 of the copper circuit pattern 40 be a margin distance d13. The margin distance d13 serves as a third margin distance.

In the planar configuration shown in FIG. 10B, a third distance from the side S3 of the RC-IGBT chip 3 to the opposite side FS3 of the copper circuit pattern 40 among the three second distances serving as the plurality of third distances serves as the margin distance d13.

With respect to the relationship between the thickness t40 of the copper circuit pattern 40 and the above-described three margin distances d11 to d13, the semiconductor device 105 satisfies the length condition that the margin distances d11 to d13 are longer than the thickness t40 of the copper circuit pattern 40. That is, the semiconductor device 105 satisfies the length condition "d11>t40, d12>t40, d13>t40".

With respect to the margin distances d11 to d13 and the thickness t40 of the copper circuit pattern 40 described above, the semiconductor device 105 of the fifth preferred embodiment satisfies the above-described length condition. Therefore, in the copper circuit pattern 40 of the semiconductor device 105, it is possible to secure relatively wide first to third heat dissipation regions from the sides S1 to S3 of the RC-IGBT chips 1 to 3 to the opposite sides FS1 to FS3 of the copper circuit pattern 40. This point will be described in detail below.

As shown in FIG. 10A, a perpendicular line V2 is drawn from the side S2 of the RC-IGBT chip 1 in the −Z direction. Furthermore, an auxiliary line L42 is drawn from the lower end P2 of the side S2 of the RC-IGBT chip 1 to the lower end P42 of the opposite side FS2 of the copper circuit pattern 40.

An angle θ2 between the perpendicular line V2 and the auxiliary line L42 determines heat dissipation characteristics on the −X direction side by the copper circuit pattern 40. This is because the region sandwiched between the perpendicular line V2 and the auxiliary line L42 in the copper circuit pattern 40 serves as the second heat dissipation region in the −X direction. Therefore, since the larger the angle θ2, the wider the second heat dissipation region of the copper circuit pattern 40, the resin insulating substrate 51 can effectively perform the heat dissipation operation from the second heat dissipation region on the −X direction side. Since the semiconductor device 105 satisfies "d12>t40", the angle θ2 is larger than 45 degrees.

As shown in FIG. 10A, a perpendicular line V3 is drawn from the side S3 of the RC-IGBT chip 3 in the −Z direction. Furthermore, an auxiliary line L43 is drawn from the lower end P3 of the side S3 of the RC-IGBT chip 2 to the lower end P43 of the opposite side FS3 of the copper circuit pattern 40.

An angle θ3 between the perpendicular line V3 and the auxiliary line L43 determines heat dissipation characteristics on the +X direction side by the copper circuit pattern 40. This is because the region sandwiched between the perpendicular line V3 and the auxiliary line L43 in the copper circuit pattern 40 serves as the third heat dissipation region on the +X direction side. Therefore, since the larger the angle θ3, the wider the third heat dissipation region of the copper circuit pattern 40, the resin insulating substrate 51 can effectively perform the heat dissipation operation from the third heat dissipation region on the +X direction side. Since the semiconductor device 105 satisfies "d13>t40", the angle θ3 is larger than 45 degrees.

Although not shown in FIGS. 10A and 10B, with regard to the first heat dissipation region in the −Y direction of the copper circuit pattern 40, the angle θ1 is determined from the margin distance d11 and the thickness t40. Since "d11>t40" is satisfied, the angle θ1 is larger than 45 degrees.

Therefore, since, as with the second and third heat dissipation regions described above, it is possible to widely secure the first heat dissipation region as well, the resin insulating substrate 51 can effectively perform the heat dissipation operation from the first heat dissipation region on the −Y direction side.

It should be noted that as described above, the heat generation from the RC-IGBT chips 1 to 3 is remarkable in the bonding point regions 61 to 63 and the periphery thereof. Therefore, effective heat dissipation operation can be performed by the semiconductor device 105 in which the first to third heat dissipation regions on the sides S1 to S3 close to the bonding point regions 61 to 63 are widened.

FIGS. 11A and 11B are explanatory diagrams schematically showing a configuration of a comparative semiconductor device 110. FIG. 11A is a cross-sectional view, and FIG. 11B is a plan view. FIG. 11A shows a cross section taken along line C-C in FIG. 11B. An XYZ orthogonal coordinate system is shown in each of FIGS. 11A and 11B.

Hereinafter, the same components as those of the semiconductor device 105 of the fifth preferred embodiment will be denoted by the same reference numerals, description thereof will be omitted as appropriate, and portions different from those of the semiconductor device 105 in the comparative semiconductor device 110 will be mainly described.

In the comparative semiconductor device 110, margin distances d21 to d23 are defined corresponding to the margin distances d11 to d13 of the semiconductor device 105.

In the comparative semiconductor device 110, regarding the thickness t40 of the copper circuit pattern 40 and the above-described margin distances d21 to d23, the margin distances d21 to d23 are shorter than the thickness t40 of the copper circuit pattern 40. That is, in the comparative semiconductor device 110, "d21<t40, d22<t40, d23<t40" holds, and the comparative semiconductor device 110 does not satisfy the length condition described above in the fifth preferred embodiment.

As shown in FIG. 11A, a perpendicular line V2 is drawn from the side S2 of the RC-IGBT chip 1 in the −Z direction. Furthermore, an auxiliary line L52 is drawn from the lower end P2 of the side S2 of the RC-IGBT chip 1 to the lower end P42 of the opposite side FS2 of the copper circuit pattern 40.

In the comparative semiconductor device 110, the angle θ12 between the perpendicular line V2 and the auxiliary line L52 is smaller than the angle θ2 of the semiconductor device 105. This is because since "d22<t40" holds, the angle θ12 is smaller than 45 degrees.

As shown in FIG. 11A, a perpendicular line V3 is drawn from the side S3 of the RC-IGBT chip 3 in the −Z direction. Furthermore, an auxiliary line L53 is drawn from the lower end P3 of the side S3 of the RC-IGBT chip 2 to the lower end P43 of the opposite side FS3 of the copper circuit pattern 40.

In the comparative semiconductor device 110, the angle θ13 between the perpendicular line V3 and the auxiliary line L53 is smaller than the angle θ3 of the semiconductor device 105. This is because since "d23<t40" holds, the angle θ13 is smaller than 45 degrees.

Although not shown in FIGS. 11A and 11B, in the comparative semiconductor device 110, with regard to the first heat dissipation region in the −Y direction of the copper circuit pattern 40, the angle θ11 is determined from the margin distance d21 and the thickness t40. Since "d21<t40" holds, the angle θ11 is smaller than 45 degrees. Therefore, the angle θ11 of the comparative semiconductor device 110 is smaller than the angle θ1 of the semiconductor device 105.

Therefore, the comparative semiconductor device 110 in which the first to third heat dissipation regions on the sides S1 to S3 close to the bonding point region 61 to 63 are narrower than those of the semiconductor device 105 cannot perform an effective heat dissipation operation.

As described above, in the semiconductor device 105 of the fifth preferred embodiment, by satisfying the length condition that the margin distances d11 to d13 are longer than t40 of the copper circuit pattern 40, the first to third heat dissipation regions in the copper circuit pattern 40 from the sides S1 to S3 of the RC-IGBT chips 1 to 3 to the opposite sides FS1 to FS3 of the copper circuit pattern 40 can be secured relatively widely.

Therefore, in the semiconductor device 105 of the fifth preferred embodiment, since the heat dissipation from the first to third heat dissipation regions through the resin insulating substrate 51 can be improved, the temperature rise of the plurality of semiconductor chips can be effectively suppressed, and the life of the device can be extended.

Sixth Preferred Embodiment

Figure 12:
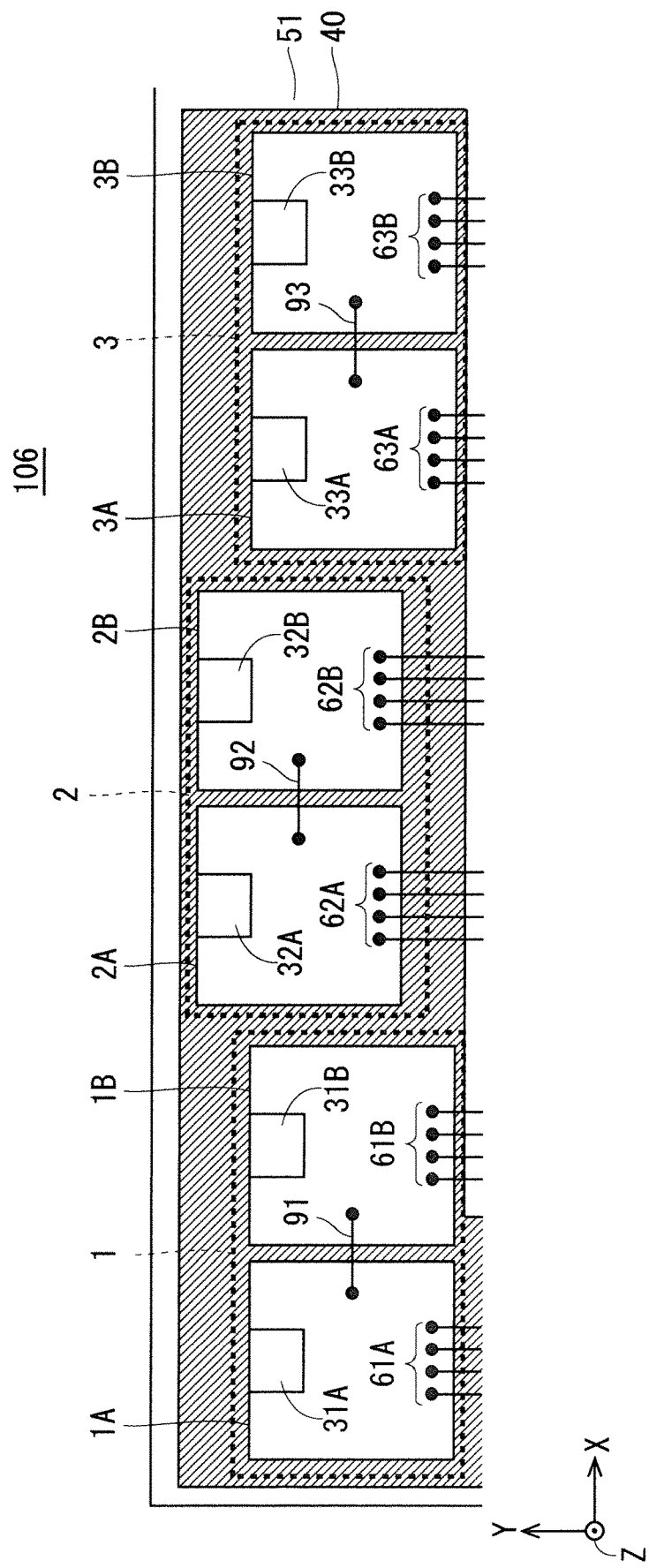
FIG. 12 is a plan view schematically showing a configuration of a semiconductor device of a sixth preferred embodiment.

FIG. 12 is a plan view schematically showing a configuration of a semiconductor device 106 according to a sixth preferred embodiment of the present disclosure. An XYZ orthogonal coordinate system is shown in FIG. 12.

Hereinafter, the same configurations as those of the semiconductor device 101 of the first preferred embodiment will be denoted by the same reference numerals, description thereof will be omitted as appropriate, and a characteristic portion of the semiconductor device 106 of the sixth preferred embodiment will be mainly described.

The semiconductor device 106 of the sixth preferred embodiment is characterized in that each of the RC-IGBT chips 1 to 3 includes a plurality of partial semiconductor chips, and the emitter electrodes serving as the first main electrodes of the plurality of partial semiconductor chips are commonly electrically connected. Hereinafter, a specific description will be given with reference to FIG. 12.

The RC-IGBT chip 1 includes RC-IGBT chips 1A and 1B each being a partial semiconductor chip. Similarly, the RC-IGBT chip 2 includes RC-IGBT chips 2A and 2B each being a partial semiconductor chip, and the RC-IGBT chip 3 includes RC-IGBT chips 3A and 3B each being a partial semiconductor chip.

Hereinafter, among the RC-IGBT chips 1A and 1B, 2A and 2B, and 3A and 3B, the RC-IGBT chips 1A and 1B will be described as representatives.

In FIG. 12, most of the region excluding the signal pad 31A on the upper surface of the RC-IGBT chip 1A serves as the emitter electrode being the first main electrode, and most of the region excluding the signal pad 31B on the upper surface of the RC-IGBT chip 1B serves as the emitter electrode being the first main electrode. Then, the lower surface of each of the RC-IGBT chips 1A and 1B serves as the collector electrode being the second main electrode.

That is, each of the RC-IGBT chips 1A and 1B includes an IGBT being a switching element, an emitter electrode serving as a first main electrode of the IGBT is provided on the upper surface, and a collector electrode serving as a second main electrode of the IGBT is provided on the lower surface. Furthermore, a diode being a reflux element is provided in parallel with respect to an IGBT of each of the RC-IGBT chips 1A and 1B.

Emitter electrodes of the RC-IGBT chips 1A and 1B are electrically connected to each other with an internal wiring line 91 such as a wire. On the other hand, the respective collector electrodes of the RC-IGBT chips 1A and 1B are electrically connected to the copper circuit pattern 40 in common.

Then, in the RC-IGBT chip 1A, a part of the emitter electrode is allocated to the bonding point region 61A being the first partial wiring connection region, and in the RC-IGBT chip 1B, a part of the emitter electrode is allocated to the bonding point region 61B being the second partial wiring connection region.

That is, in the sixth preferred embodiment, the wiring connection region of the RC-IGBT chip 1 is a combination of the first and second partial wiring connection regions.

It should be noted that connection contents of the wires 7 to the copper circuit patterns 41 to 43 in the semiconductor device 106 of the sixth preferred embodiment will be described in the section of the seventh preferred embodiment described below.

In the semiconductor device 106 of the sixth preferred embodiment, the RC-IGBT chips 1A and 1B being a plurality of partial semiconductor chips are characterized by being arranged to overlap each other so as to entirely overlap each other including the bonding point regions 61A and 61B in the Y direction. That is, the formation positions in the Y direction of the bonding point regions 61A and 61B are the same between the RC-IGBT chips 1A and 1B.

It should be noted that the RC-IGBT chips 2A and 2B and the RC-IGBT chips 3A and 3B also have the same characteristics as the RC-IGBT chips 1A and 1B. That is, the signal pads 32A and 32B and the signal pads 33A and 33B have the same characteristics as the signal pads 31A and 31B, and the bonding point regions 62A and 62B and the bonding point regions 63A and 63B have the same characteristics as the bonding point regions 61A and 61B.

In addition, the internal wiring lines 92 and 93 have the same characteristics as the internal wiring line 91. That is, the emitter electrodes of the RC-IGBT chips 2A and 2B are electrically connected with the internal wiring line 92 such as a wire, and the emitter electrodes of the RC-IGBT chips 3A and 3B are electrically connected with the internal wiring line 93 such as a wire.

Furthermore, in the semiconductor device 106, the RC-IGBT chips 2A and 2B are characterized by being arranged to overlap each other so as to entirely overlap each other including the bonding point regions 62A and 62B in the Y direction. That is, the formation positions in the Y direction of the bonding point regions 62A and 62B are the same between the RC-IGBT chips 2A and 2B.

Similarly, in the semiconductor device 106, the RC-IGBT chips 3A and 3B are characterized by being arranged to overlap each other so as to entirely overlap each other including the bonding point regions 63A and 63B in the Y direction. That is, the formation positions in the Y direction of the bonding point regions 63A and 63B are the same between the RC-IGBT chips 3A and 3B.

As described above, in the semiconductor device 106 of the sixth preferred embodiment, the combination structure of a plurality of partial semiconductor chips is dealt with as one unit of semiconductor chip. That is, the combination of the RC-IGBT chips 1A and 1B is dealt with as one unit of RC-IGBT chip 1, the combination of the RC-IGBT chips 2A and 2B is dealt with as one unit of RC-IGBT chip 2, and the combination of the RC-IGBT chips 3A and 3B is dealt with as one unit of RC-IGBT chip 3.

Therefore, the RC-IGBT chips 1 to 3 each including a combination of a plurality of partial semiconductor chips have properties electrically equivalent to those of the RC-IGBT chips 1 to 3 described in the first to fifth preferred embodiments.

Therefore, the semiconductor device 106 of the sixth preferred embodiment also achieves the equivalent circuit shown in FIG. 3 as in the first preferred embodiment. For example, in the RC-IGBT chip 1, two IGBTs formed in the RC-IGBT chips 1A and 1B are connected in parallel to constitute an IGBT 11, and two diodes formed in the RC-IGBT chips 1A and 1B are connected in parallel to constitute a diode D11.

However, the semiconductor device 106 of the sixth preferred embodiment satisfies the first and second arrangement conditions regarding the RC-IGBT chips 1 to 3, as with the semiconductor device 101 of the first preferred embodiment. This point will be described in detail below.

The RC-IGBT chips 1B and 2A and the RC-IGBT chips 2B and 3A correspond to a pair of RC-IGBT chips adjacent to each other in the X direction between the RC-IGBT chips 1 to 3.

In the RC-IGBT chips 1B and 2A, the bonding point region 61B and the bonding point region 62A are separately arranged without overlapping each other in the Y direction. Similarly, in the RC-IGBT chips 2B and 3A, the bonding point region 62B and the bonding point region 63A are separately arranged without overlapping each other in the Y direction.

As described above, the semiconductor device 106 of the sixth preferred embodiment satisfies the first arrangement condition with regard to the RC-IGBT chip 1 to 3 being a plurality of semiconductor chips, as in the first preferred embodiment.

In addition, in the Y direction, the RC-IGBT chips 1B and 2A are arranged to partially overlap so that a part of the emitter electrodes excluding the bonding point region 61B and the bonding point region 62A overlap. Similarly, in the Y direction, the RC-IGBT chips 2B and 3A are arranged to partially overlap so that a part of the emitter electrodes excluding the bonding point region 62B and the bonding point region 63A overlap.

As described above, the semiconductor device 106 of the sixth preferred embodiment satisfies the second arrangement condition with regard to the RC-IGBT chip 1 to 3 being a plurality of semiconductor chips, as in the first preferred embodiment.

Since the semiconductor device 106 of the sixth preferred embodiment satisfies the first and second arrangement characteristics described above as in the first preferred embodiment, it is possible to simultaneously achieve a long life and miniaturization of the device.

In the semiconductor device 106 of the sixth preferred embodiment, the RC-IGBT chip 1 includes the RC-IGBT chips 1A and 1B, the RC-IGBT chip 2 includes the RC-IGBT chips 2A and 2B, and the RC-IGBT chip 3 includes the RC-IGBT chips 3A and 3B. Therefore, in the semiconductor device 106, the arrangement area of each of the RC-IGBT chips 1 to 3 in the copper circuit pattern 40 can be increased.

As a result, since in the semiconductor device 106 of the sixth preferred embodiment, the heat dissipation property along the formation direction of the copper circuit pattern 40 can be improved, it is possible to effectively suppress the temperature rise of each of the RC-IGBT chips 1 to 3 to extend the life of the device.

Furthermore, in the semiconductor device 106, the plurality of partial semiconductor chips are arranged to overlap each other so as to include the partial wiring connection regions in the Y direction and overlap each other. For example, the RC-IGBT chips 1A and 1B are arranged so as to entirely overlap each other including the bonding point regions 61A and 61B in the Y direction.

Therefore, in the semiconductor device 106 of the sixth preferred embodiment, since the formation length in the Y direction in each of the RC-IGBT chips 1 to 3 can be reduced to the minimum necessary, each of the RC-IGBT chips 1 to 3 can be miniaturized.

Seventh Preferred Embodiment

Figure 13:
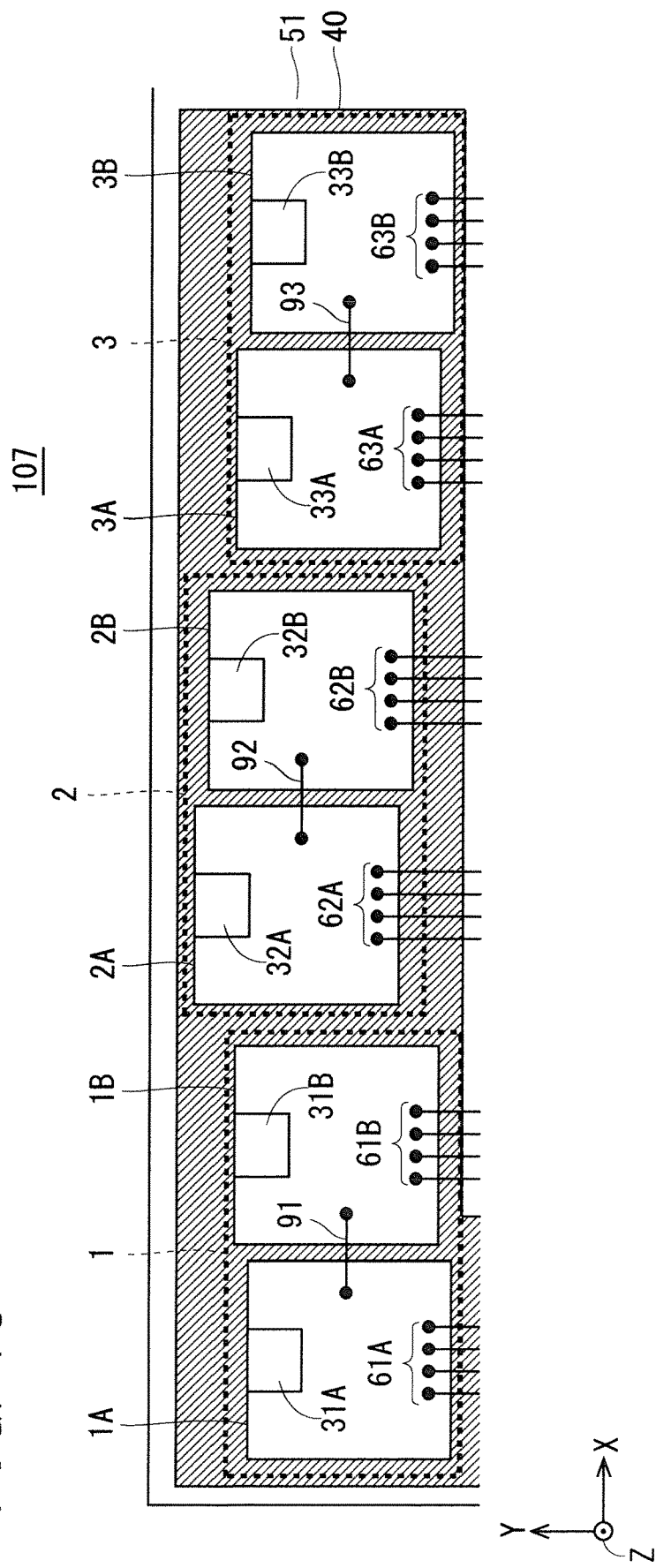
FIG. 13 is a plan view schematically showing a configuration of a semiconductor device of a seventh preferred embodiment.

FIG. 13 is a plan view schematically showing a configuration of a semiconductor device 107 according to a seventh preferred embodiment of the present disclosure. An XYZ orthogonal coordinate system is shown in FIG. 13.

Hereinafter, the same configurations as those of the semiconductor device 106 of the sixth preferred embodiment will be denoted by the same reference numerals, description thereof will be omitted as appropriate, and a characteristic portion of the semiconductor device 107 of the seventh preferred embodiment will be mainly described.

As in the sixth preferred embodiment, the semiconductor device 107 of the seventh preferred embodiment is characterized in that each of the RC-IGBT chips 1 to 3 includes a plurality of partial semiconductor chips, and the emitter electrodes serving as the first main electrodes of the plurality of partial semiconductor chips are commonly electrically connected. Hereinafter, a specific description will be given with reference to FIG. 13.

The RC-IGBT chip 1 includes RC-IGBT chips 1A and 1B each being a partial semiconductor chip. Similarly, the RC-IGBT chip 2 includes RC-IGBT chips 2A and 2B each being a partial semiconductor chip, and the RC-IGBT chip 3 includes RC-IGBT chips 3A and 3B each being a partial semiconductor chip.

In the semiconductor device 107 of the seventh preferred embodiment, as in the sixth preferred embodiment, the combination structure of the plurality of partial semiconductor chips is dealt with as one unit of semiconductor chip.

Figure 14:
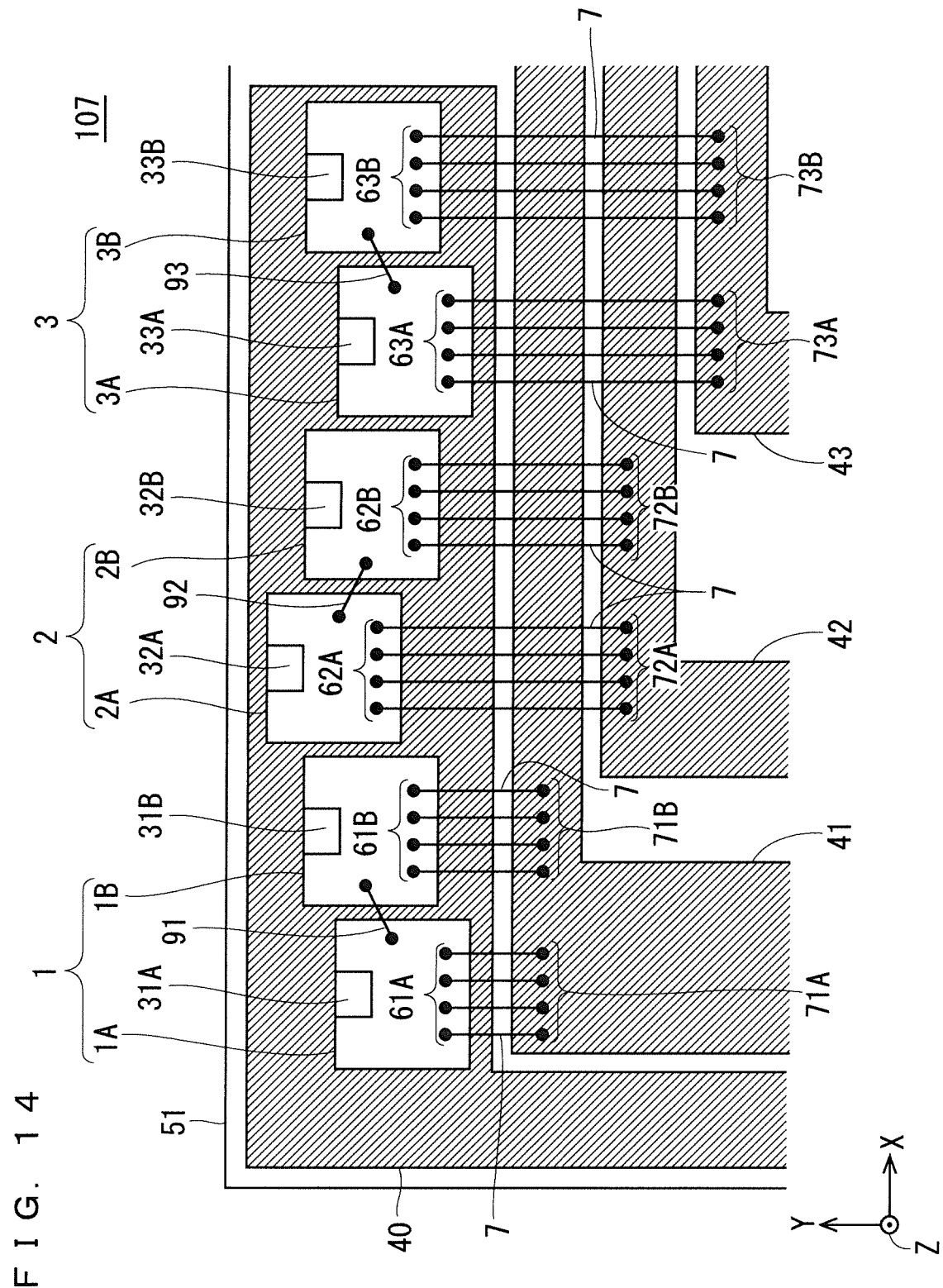
FIG. 14 is a plan view showing connection contents of wires to three copper circuit patterns of the semiconductor device of the seventh preferred embodiment.

FIG. 14 is a plan view showing connection contents of the wires 7 to the copper circuit patterns 41 to 43 of the semiconductor device 107 of the seventh preferred embodiment.

As shown in FIG. 14, the bonding point region 61A of the RC-IGBT chip 1A and the bonding point region 71A of the copper circuit pattern 41 are electrically connected through the wires 7, and the bonding point region 61B of the RC-IGBT chip 1B and the bonding point region 71B of the copper circuit pattern 41 are electrically connected through the wires 7.

Therefore, since the combination of the bonding point regions 61A and 61B serves as the wiring connection region of the RC-IGBT chip 1, the electrical connection relationship between the emitter electrode of the RC-IGBT chip 1 and the copper circuit pattern 41 is equivalent to that of the first to fifth preferred embodiments.

As shown in FIG. 14, the bonding point region 62A of the RC-IGBT chip 2A and the bonding point region 72A of the copper circuit pattern 42 are electrically connected through the wires 7, and the bonding point region 62B of the RC-IGBT chip 2B and the bonding point region 72B of the copper circuit pattern 42 are electrically connected through the wires 7.

Therefore, since the combination of the bonding point regions 62A and 62B serves as the wiring connection region of the RC-IGBT chip 2, the electrical connection relationship between the emitter electrode of the RC-IGBT chip 2 and the copper circuit pattern 42 is equivalent to that of the first to fifth preferred embodiments.

As shown in FIG. 14, the bonding point region 63A of the RC-IGBT chip 3A and the bonding point region 73A of the copper circuit pattern 43 are electrically connected through the wires 7, and the bonding point region 63B of the RC-IGBT chip 3B and the bonding point region 73B of the copper circuit pattern 43 are electrically connected through the wires 7.

Therefore, since the combination of the bonding point regions 63A and 63B serves as the wiring connection region of the RC-IGBT chip 3, the electrical connection relationship between the emitter electrode of the RC-IGBT chip 3 and the copper circuit pattern 43 is equivalent to that of the first to fifth preferred embodiments.

As described above, in the semiconductor device 107 of the seventh preferred embodiment, the electrical connection relationship between the emitter electrodes of the RC-IGBT chips 1 to 3 and the copper circuit patterns 41 to 43 is equivalent to that of the first to fifth preferred embodiments.

Furthermore, the RC-IGBT chips 1 to 3 each including a combination of a plurality of partial semiconductor chips have properties electrically equivalent to those of the RC-IGBT chips 1 to 3 described in the first to fifth preferred embodiments.

It should be noted that also in the semiconductor device 106 of the sixth preferred embodiment, the emitter electrodes of the RC-IGBT chips 1 to 3 and the copper circuit patterns 41 to 43 are electrically connected as shown in FIG. 14. Therefore, the electrical connection relationship between the emitter electrodes of the RC-IGBT chips 1 to 3 and the copper circuit patterns 41 to 43 in the sixth preferred embodiment is also equivalent to that in the first to fifth preferred embodiments.

Therefore, in the semiconductor device 106 of the sixth preferred embodiment and the semiconductor device 107 of the seventh preferred embodiment, the equivalent circuit shown in FIG. 3 can be configured with the RC-IGBT chips 1 to 6 as in the first preferred embodiment.

As described above, the semiconductor device 107 of the seventh preferred embodiment has the same characteristics as the semiconductor device 106 of the sixth preferred embodiment. Hereinafter, characteristics unique to the semiconductor device 107 of the seventh preferred embodiment will be described.

In the semiconductor device 107, a pair of partial semiconductor chips adjacent to each other in the X direction among the plurality of partial semiconductor chips satisfies third and fourth arrangement conditions described below.

It should be noted that in the RC-IGBT chip 1, the RC-IGBT chips 1A and 1B correspond to a pair of partial semiconductor chips adjacent to each other in the X direction.

Between the RC-IGBT chips 1A and 1B, the bonding point region 61A and the bonding point region 61B are separately arranged without overlapping each other in the Y direction.

Therefore, the semiconductor device 107 of the seventh preferred embodiment satisfies the following third arrangement condition.

Third arrangement condition . . . A condition that in a pair of semiconductor chips adjacent to each other in the X direction among the plurality of partial semiconductor chips, the partial wiring connection regions are separately arranged without overlapping each other in the Y direction.

In the Y direction, the RC-IGBT chips 1A and 1B are arranged to partially overlap so that a part of the emitter electrodes excluding the bonding point regions 61A and 61B overlap.

Therefore, the semiconductor device 101 of the first preferred embodiment satisfies the following fourth arrangement condition.

Fourth arrangement condition . . . A condition that a pair of partial semiconductor chips adjacent to each other in the X direction among the plurality of partial semiconductor chips is arranged to partially overlap in the Y direction so that a part of the regions other than the partial wiring connection regions overlap.

It should be noted that as with the RC-IGBT chips 1A and 1B, the RC-IGBT chips 2A and 2B and the RC-IGBT chips 3A and 3B also satisfy the third and fourth arrangement conditions described above.

As described above, unlike the semiconductor device 106, in the semiconductor device 107 of the seventh preferred embodiment, a pair of partial semiconductor chips adjacent to each other among the plurality of partial semiconductor chips satisfies the third and fourth arrangement conditions described above.

Furthermore, the semiconductor device 107 of the seventh preferred embodiment also satisfies the first and second arrangement characteristics as with the semiconductor device 101 of the first preferred embodiment and the semiconductor device 106 of the sixth preferred embodiment. This point will be described in detail below.

The RC-IGBT chips 1B and 2A and the RC-IGBT chips 2B and 3A correspond to a pair of RC-IGBT chips adjacent to each other in the X direction between the RC-IGBT chips 1 to 3.

In the RC-IGBT chips 1B and 2A, the bonding point region 61B and the bonding point region 62A are separately arranged without overlapping each other in the Y direction. Similarly, in the RC-IGBT chips 2B and 3A, the bonding point region 62B and the bonding point region 63A are separately arranged without overlapping each other in the Y direction.

As described above, the semiconductor device 107 of the seventh preferred embodiment satisfies the first arrangement characteristics with regard to the RC-IGBT chip 1 to 3 serving as a plurality of semiconductor chips, as in the first preferred embodiment.

In the Y direction, the RC-IGBT chips 1B and 2A are arranged to partially overlap so that a part of the emitter electrodes excluding the bonding point region 61B and the bonding point region 62A overlap. Similarly, in the Y direction, the RC-IGBT chips 2B and 3A are arranged to partially overlap so that a part of the emitter electrodes excluding the bonding point region 62B and the bonding point region 63A overlap.

As described above, the semiconductor device 107 of the seventh preferred embodiment satisfies the second arrangement characteristics with regard to the RC-IGBT chip 1 to 3 serving as a plurality of semiconductor chips, as in the first preferred embodiment.

Since the semiconductor device 107 of the seventh preferred embodiment satisfies the first and second arrangement characteristics described above as in the first preferred embodiment, it is possible to simultaneously achieve a long life and miniaturization of the device.

In the semiconductor device 107 of the seventh preferred embodiment, since the RC-IGBT chip 1, the RC-IGBT chip 2, and the RC-IGBT chip 3 include the RC-IGBT chips 1A and 1B, 2A and 2B, and 3A and 3B, the arrangement area of each of the RC-IGBT chips 1 to 3 in the copper circuit pattern 40 can be increased.

As a result, since in the semiconductor device 107 of the seventh preferred embodiment, as in the sixth preferred embodiment, the heat dissipation property along the formation direction of the copper circuit pattern 40 can be improved, it is possible to effectively suppress the temperature rise of each of the RC-IGBT chips 1 to 3 to extend the life of the device.

Furthermore, in the semiconductor device 107, each of the RC-IGBT chips 1 to 3 being a plurality of semiconductor chips satisfies the above-described third arrangement condition.

Therefore, in each of the RC-IGBT chips 1 to 3, the distance between the partial wiring connection regions in the pair of partial semiconductor chips can be increased to suppress thermal interference between the pair of partial semiconductor chips. For example, in the RC-IGBT chip 1, the distance between the bonding point regions 61A and 61B in the RC-IGBT chips 1A and 1B can be increased to suppress thermal interference between the RC-IGBT chips 1A and 1B.

As a result, in each of the RC-IGBT chips 1 to 3 in the semiconductor device 107 of the seventh preferred embodiment, it is possible to suppress a temperature rise inside a plurality of partial semiconductor chips to achieve a long life. For example, in the RC-IGBT chip 1, it is possible to suppress a temperature rise inside each of the RC-IGBT chips 1A and 1B to achieve a long life.

Furthermore, in the semiconductor device 107, each of the RC-IGBT chips 1 to 3 being a plurality of semiconductor chips satisfies the above-described fourth arrangement condition.

Therefore, in the semiconductor device 107 of the seventh preferred embodiment, it is possible to reduce the formation area of the plurality of partial semiconductor chips provided on the copper circuit pattern 40 to the minimum necessary and to miniaturize each chip. For example, regarding the RC-IGBT chip 1 provided on the copper circuit pattern 40, it is possible to reduce the formation area of the RC-IGBT chips 1A and 1B to the minimum necessary and to miniaturize the RC-IGBT chip 1.

Eighth Preferred Embodiment

FIGS. 15A and 15B are explanatory diagrams schematically showing a configuration of a semiconductor device 108 being an eighth preferred embodiment of the present disclosure. FIG. 15A is a cross-sectional view, and FIG. 15B is a plan view. FIG. 15A shows a cross section taken along line D-D in FIG. 15B. An XYZ orthogonal coordinate system is shown in each of FIGS. 15A and 15B.

Hereinafter, the same configurations as those of the semiconductor device 101 of the first preferred embodiment will be denoted by the same reference numerals, description thereof will be omitted as appropriate, and a characteristic portion of the semiconductor device 108 of the eighth preferred embodiment will be mainly described. It should be noted that as in the first preferred embodiment, the semiconductor device 108 also achieves an equivalent circuit shown in FIG. 3.

As shown in FIG. 15A, the semiconductor device 108 further includes a resin insulating substrate 51 and a base plate 52, the resin insulating substrate 51 is provided on the base plate 52, and the copper circuit pattern 40B is provided on the resin insulating substrate 51.

Thus, the semiconductor device 108 further includes a resin insulating substrate 51 being an insulating substrate on whose upper surface a copper circuit pattern 40B being a common circuit pattern is provided.

The semiconductor device 108 of the eighth preferred embodiment is characterized in that the thickness t40B being the film thickness of the copper circuit pattern 40B is set to 0.3 mm or more.

It should be noted that the copper circuit pattern 40B has the same characteristics as the copper circuit pattern 40 described in the first to seventh preferred embodiments except that the thickness t40B serving as the film thickness of the copper circuit pattern 40B is set to 0.3 mm or more.

In the semiconductor device 108 of the eighth preferred embodiment, setting the thickness t40B of the copper circuit pattern 40B being the common circuit pattern to 0.3 mm or more allows the heat dissipation with the copper circuit pattern 40B to be improved, so that the reliability of the device can be improved.

Ninth Preferred Embodiment

FIG. 16 is a plan view schematically showing a planar configuration of a semiconductor device 109 according to a ninth preferred embodiment of the present disclosure. An XYZ orthogonal coordinate system is shown in FIG. 16.

Hereinafter, the same configurations as those of the semiconductor device 101 of the first preferred embodiment will be denoted by the same reference numerals, description thereof will be omitted as appropriate, and a characteristic portion of the semiconductor device 109 of the ninth preferred embodiment will be mainly described.

As shown in FIG. 16, the semiconductor device 109 of the ninth preferred embodiment is characterized in that the RC-IGBT chips 1 to 6 are replaced with SiC-MOSFET chips 1S to 6S.

Each of the SiC-MOSFET chips iS (i=any one of 1 to 6) has an N-channel MOSFET being a switching element. Each MOSFET is formed on a SiC substrate. It should be noted that the MOSFET may be a planar type or a trench type.

In FIG. 16, most regions excluding the signal pads 31 to 36 of the upper surfaces of the SiC-MOSFET chips 1S to 6S serve as the first main electrodes, and the respective lower surfaces of the SiC-MOSFET chips 1S to 6S serve as the second main electrodes. Then, the signal pads 31 to 36 function as control electrodes of the MOSFETs.

The SiC-MOSFET chips 1S to 3S are used for the upper arms UP, VP, and WP of the three-phase AC inverter, and the SiC-MOSFET chips 4S to 6S are used for the lower arms UN, VN, and WN of the three-phase AC inverter. Therefore, in the equivalent circuit of the semiconductor device 101 shown in FIG. 3, a circuit configuration in which the combination of the IGBT 1i and the diode D1i (i=any one of 1 to 6) is replaced by the SiC-MOSFET is the circuit configuration of the semiconductor device 109 of the ninth preferred embodiment.

In the semiconductor device 109 of the ninth preferred embodiment, characteristics other than those described above are the same as the characteristics of the first preferred embodiment. Therefore, with respect to the SiC-MOSFET chips 1S to 3S as a plurality of semiconductor chips, as in the first preferred embodiment, the semiconductor device 109 of the ninth preferred embodiment satisfies the first and second arrangement characteristics.

Therefore, in the semiconductor device 109 of the ninth preferred embodiment including the SiC-MOSFET chips 1S to 3S each having a circuit configuration including a SiC-MOSFET, it is possible to achieve miniaturization and long life of the device as in the first preferred embodiment.

Furthermore, in the semiconductor device 109 of the ninth preferred embodiment, using the SiC-MOSFET for each of the SiC-MOSFET chips 1S to 6S allows the switching time to be shortened and the switching loss to be reduced.

It should be noted that in the ninth preferred embodiment shown in FIG. 16, a configuration is shown in which the RC-IGBT chips 1 to 6 are replaced with the SiC-MOSFET chips 1S to 6S in the configuration of the first preferred embodiment. The present disclosure is not limited to this configuration, and the RC-IGBT chips 1 to 6 may be replaced with SiC-MOSFET chips 1S to 6S in the configurations of the second to eighth preferred embodiments.

<Others>

It should be noted that in the present disclosure, each preferred embodiment can be freely combined, and each preferred embodiment can be appropriately modified, or omitted within the scope of the present disclosure.

For example, in the above-described preferred embodiment, three semiconductor chips such as the RC-IGBT chips 1 to 3 or the SiC-MOSFET chips 1S to 3S are shown as the plurality of semiconductor chips satisfying the first and second arrangement characteristics, but the present disclosure can be extended to four or more semiconductor chips.

For example, the semiconductor device 107 of the seventh preferred embodiment shown in FIGS. 13 and 14 can be regarded as six partial semiconductor chips including the RC-IGBT chips 1A and 1B, the RC-IGBT chips 2A and 2B, and the RC-IGBT chips 3A and 3B provided on the copper circuit pattern 40 as a plurality of semiconductor chips provided on the same common circuit pattern.

In this case, regarding the first to fourth arrangement conditions described in the seventh preferred embodiment, the first arrangement condition and the third arrangement condition are the same conditions, and the second arrangement condition and the fourth arrangement condition are the same conditions.

Therefore, when each of the six partial semiconductor chips in the semiconductor device 107 of the seventh preferred embodiment is dealt with as one unit of semiconductor chip, the semiconductor device 107 satisfies the first and second arrangement characteristics described above as in the first preferred embodiment.

While the disclosure has been shown and described in detail, the foregoing description is in all aspects illustrative and not restrictive. It is therefore understood that numerous modifications and variations can be devised.

What is claimed is:

1. A semiconductor device comprising:
   a common circuit pattern; and
   a plurality of semiconductor chips arranged along a first direction on the common circuit pattern,
   wherein each of the plurality of semiconductor chips includes a switching element, a first main electrode of the switching element is provided on an upper surface, a second main electrode of the switching element is provided on a lower surface, and a part of a first main electrode is allocated to a wiring connection region,
   the semiconductor device further comprises
   a plurality of external wiring lines each of which is electrically connected to the wiring connection region of a corresponding semiconductor chip among the plurality of semiconductor chips, wherein a pair of semiconductor chips adjacent to each other in the first direction among the plurality of semiconductor chips satisfies both of first and second arrangement conditions, the first arrangement condition is that the pair of semiconductor chips is separately arranged without the wiring connection regions overlapping each other in a second direction intersecting the first direction, and the second arrangement condition is that, in the second direction, the pair of semiconductor chips is arranged to partially overlap so that a part of regions other than the wiring connection regions overlap.

2. The semiconductor device according to claim 1, wherein the plurality of semiconductor chips are classified into a first number of first type semiconductor chips and a second number of second type semiconductor chips, the first number of first type semiconductor chips and the second number of second type semiconductor chips are alternately arranged along the first direction, and the first number is the second number or more, the semiconductor device further comprises:

a first number of first type external terminals for the first number of first type semiconductor chips, and a second number of second type external terminals for the second number of second type semiconductor chips, wherein wiring lines that electrically connect the wiring connection regions of the first number of first type semiconductor chips and the first number of first type external terminals are defined as a first number of first type external wiring lines, wiring lines that electrically connect the wiring connection regions of the second number of second type semiconductor chips and the second number of second type external terminals are defined as a second number of second type external wiring lines, and the plurality of external wiring lines include the first number of first type external wiring lines and the second number of second type external wiring lines, and a wiring length of the first number of first type external wiring lines is set to be shorter than a wiring length of the second number of second type external wiring lines.

3. The semiconductor device according to claim 1, further comprising:

a plurality of relay terminals provided corresponding to the plurality of semiconductor chips, and a plurality of relay wires electrically connecting the wiring connection regions of the plurality of semiconductor chips and the plurality of relay terminals, wherein the plurality of external wiring lines include the plurality of relay terminals and the plurality of relay wires, the plurality of relay terminals are electrically independent of each other, and wiring lengths of the plurality of relay wires are set to be same.

4. The semiconductor device according to claim 1, further comprising:

a control electrode of the switching element on an upper surface of each of the plurality of semiconductor chips, and a plurality of control wiring lines electrically connected to control electrodes of the plurality of semiconductor chips, wherein each of the plurality of control wiring lines is provided to extend in a control wiring direction from the control electrode, the plurality of external wiring lines are provided to extend in an external wiring direction from the wiring connection regions of the plurality of semiconductor chips, and the control wiring direction and the external wiring direction are set in opposite directions away from each other.

5. The semiconductor device according to claim 4, wherein each of the wiring connection regions of the plurality of semiconductor chips includes first and second separation wiring connection regions provided separately from each other along the second direction, and each of the plurality of external wiring lines is electrically connected to the first separation wiring connection region and the second separation wiring connection region.

6. The semiconductor device according to claim 1, further comprising an insulating substrate on an upper surface of which the common circuit pattern is provided, wherein each of the plurality of semiconductor chips has a rectangular shape having first to fourth sides in a plan view, the wiring connection region of each of the plurality of semiconductor chips is provided along the first direction on a side of the first side among the first to fourth sides, and the second and third sides are sides adjacent to the first side, the common circuit pattern has first to third opposite sides opposite to the first to third sides in a plan view, a shortest distance among a plurality of first distances from the first side of each of the plurality of semiconductor chips to the first opposite side of the common circuit pattern is defined as a first margin distance, a shortest distance among a plurality of second distances from the second side of each of the plurality of semiconductor chips to the second opposite side of the common circuit pattern is defined as a second margin distance, a shortest distance among a plurality of third distances from the third side of each of the plurality of semiconductor chips to the third opposite side of the common circuit pattern is defined as a third margin distance, and the first to third margin distances are longer than a film thickness of the common circuit pattern.

7. The semiconductor device according to claim 1, wherein each of the plurality of semiconductor chips includes a plurality of partial semiconductor chips, and first main electrodes of the plurality of partial semiconductor chips are electrically connected in common.

8. The semiconductor device according to claim 7, wherein a part of the first main electrode of each of the plurality of partial semiconductor chips is assigned as a partial wiring connection region, and the plurality of partial semiconductor chips are arranged to overlap each other so as to include the partial wiring connection region in the second direction.

9. The semiconductor device according to claim 7, wherein a part of the first main electrode of each of the plurality of partial semiconductor chips is assigned as a partial wiring connection region, a pair of partial semiconductor chips adjacent to each other in the first direction among the plurality of partial semiconductor chips satisfies third and fourth arrangement conditions, the third arrangement condition is that the pair of partial semiconductor chips is separately arranged without the partial wiring connection regions overlapping each other in the second direction, and the fourth arrangement condition is that the pair of partial semiconductor chips is arranged to partially overlap so that in the second direction, a part of regions other than the partial wiring connection regions overlap.

10. The semiconductor device according to claim 1, wherein a film thickness of the common circuit pattern is 0.3 mm or more.

11. The semiconductor device according to claim 1, wherein each of the plurality of semiconductor chips includes a combination of the switching element and a reflux element, and the plurality of semiconductor chips are used for an upper arm of an inverter.

12. The semiconductor device according to claim 1, wherein the switching element is a SiC-MOSFET.

* * * * *